(12) United States Patent
Gregoire et al.

(10) Patent No.: US 11,085,944 B1
(45) Date of Patent: Aug. 10, 2021

(54) OPTICALLY LEVITATED NANOPARTICLE ACCELEROMETER

(71) Applicant: Government of the United States, as represented by the Secretary of the Air Force, Kirtland AFB, NM (US)

(72) Inventors: Maxwell D. Gregoire, Albuquerque, NM (US); Brian L. Kasch, Albuquerque, NM (US)

(73) Assignee: The Government of the United States of America as represented by the Secretary of the Air Force, Kirtland AFB, NM (US)

( * ) Notice: Subject to any disclaimer, the term of this patent is extended or adjusted under 35 U.S.C. 154(b) by 132 days.

(21) Appl. No.: 16/268,271

(22) Filed: Feb. 5, 2019

Related U.S. Application Data

(60) Provisional application No. 62/652,814, filed on Apr. 4, 2018.

(51) Int. Cl.
*G01P 15/093* (2006.01)
*H03L 7/26* (2006.01)
*H03B 17/00* (2006.01)

(52) U.S. Cl.
CPC ............ *G01P 15/093* (2013.01); *H03B 17/00* (2013.01); *H03L 7/26* (2013.01)

(58) Field of Classification Search
CPC ...... G01P 1/07; G01P 1/12; G01P 3/36; G01P 15/093; H03B 17/00; H03L 7/26
USPC .......................................... 73/514.26, 514.27
See application file for complete search history.

(56) References Cited

U.S. PATENT DOCUMENTS

| | | | | |
|---|---|---|---|---|
| 3,808,550 A | * | 4/1974 | Ashkin | ..................... H05H 3/02 |
| | | | | 372/97 |
| 2004/0239937 A1 | * | 12/2004 | Post | ....................... G01C 21/16 |
| | | | | 356/450 |

OTHER PUBLICATIONS

Yin, Z., et al., "Optomechanics of Levitated Dielectric Particles," Int. J. Mod. Phys. B 27, Aug. 22, 2013, pp. 1-16.
Li, T., et al., "Measurement of the Instantaneous Velocity of a Brownian Particle," Science, vol. 328, Jun. 25, 2010, pp. 1673-1675.
Gieseler, J.,et. al., "Subkelvin parametric feedback cooling of a laser-trapped nanoparticle," Phys. Rev. Lett. 109, 103603-1 to 103603-5 with Supplementary Information S1-S10, Sep. 7, 2012.
(Continued)

*Primary Examiner* — Benjamin R Schmitt
(74) *Attorney, Agent, or Firm* — AFNWC/JA; David L. Narciso

(57) ABSTRACT

An accelerometer includes a vacuum chamber to receive a laser beam and a nanoparticle. The nanoparticle is trapped in an oscillating state in a focus of the laser beam. A processor calculates an acceleration of the nanoparticle based on changes in position of an oscillating nanoparticle. A plurality of photodetectors are spaced apart to identify spatial coordinates of the oscillating nanoparticle. The processor may calculate the acceleration of the nanoparticle based on changes in the spatial coordinates of the oscillating nanoparticle and a frequency of oscillation of the nanoparticle within the vacuum chamber. The nanoparticle may have a diameter of a predetermined size and is trapped in the focus of the laser beam based on a polarizability of the nanoparticle. The diameter of the predetermined size of the nanoparticle may be smaller than a wavelength of the laser beam.

19 Claims, 20 Drawing Sheets

(56) References Cited

OTHER PUBLICATIONS

Ranjit, G., et al., "Zeptonewton force sensing with nanospheres in an optical lattice," Phys. Rev. A 93, Mar. 10, 2016, pp. 1-5.
Monteiro, F., et al., "Optical levitation of 10 nanogram spheres with nano-g acceleration sensitivity," Phys. Rev. A96, 063841, Nov. 13, 2017, pp. 1-7.
Butts, D., "Development of a Light Force Accelerometer," Ph.D. thesis, Massachusetts Institute of Technology, May 2008, 96 pages.

\* cited by examiner

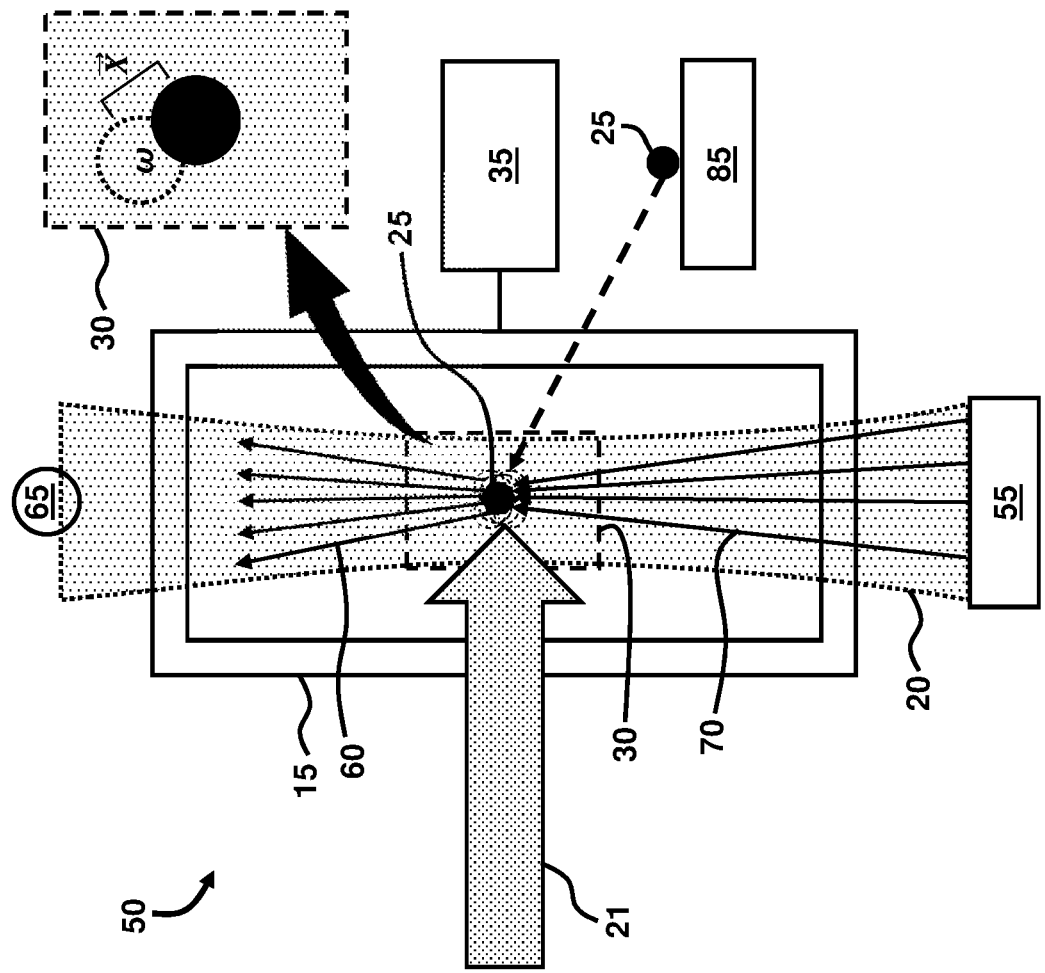

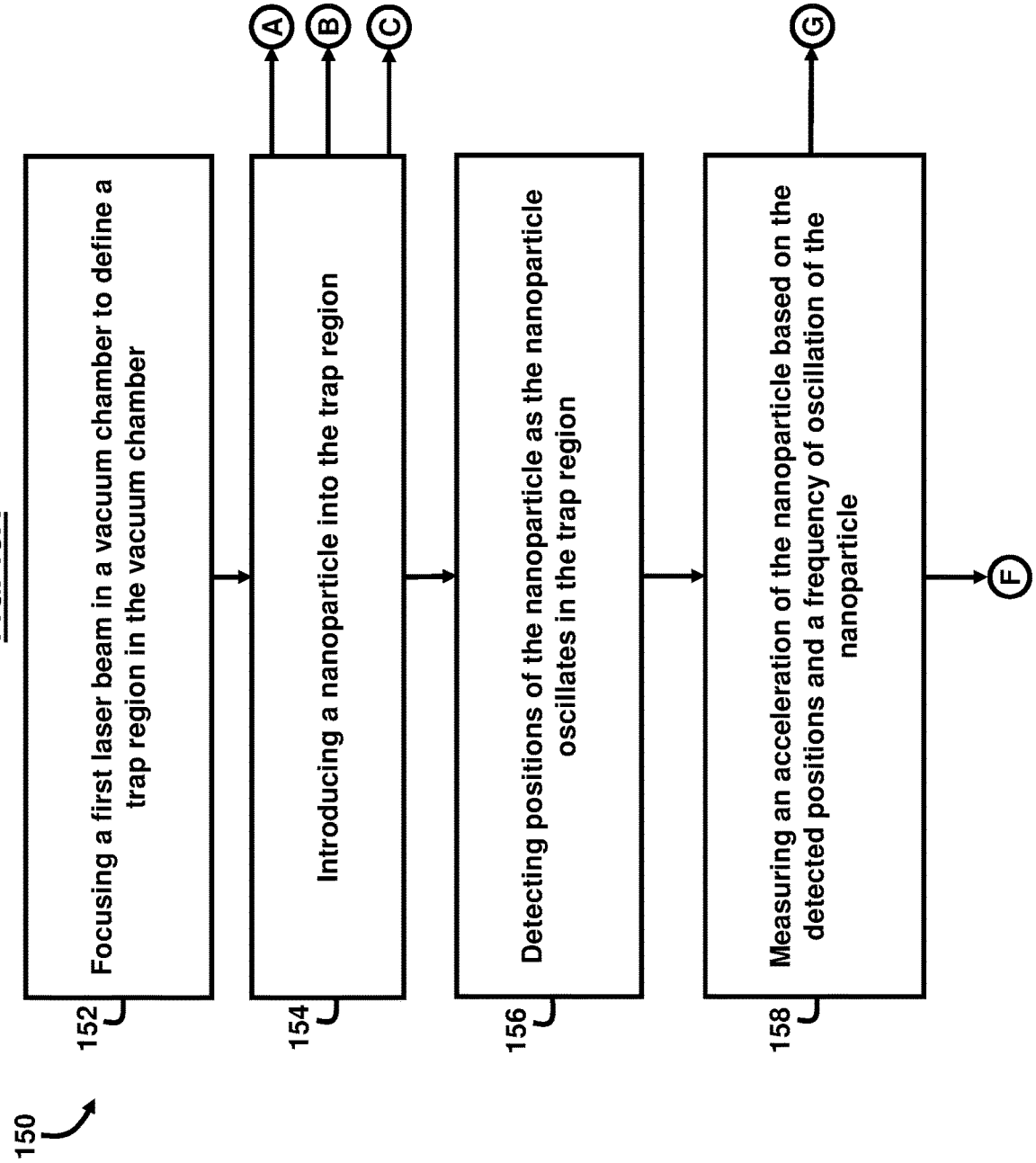

FIG. 15B

150 → 160 — Spraying an aerosol comprising the nanoparticle into the vacuum chamber ← A

FIG. 15C

150 → 162 — Providing an inert gas comprising the nanoparticle into the vacuum chamber ← B

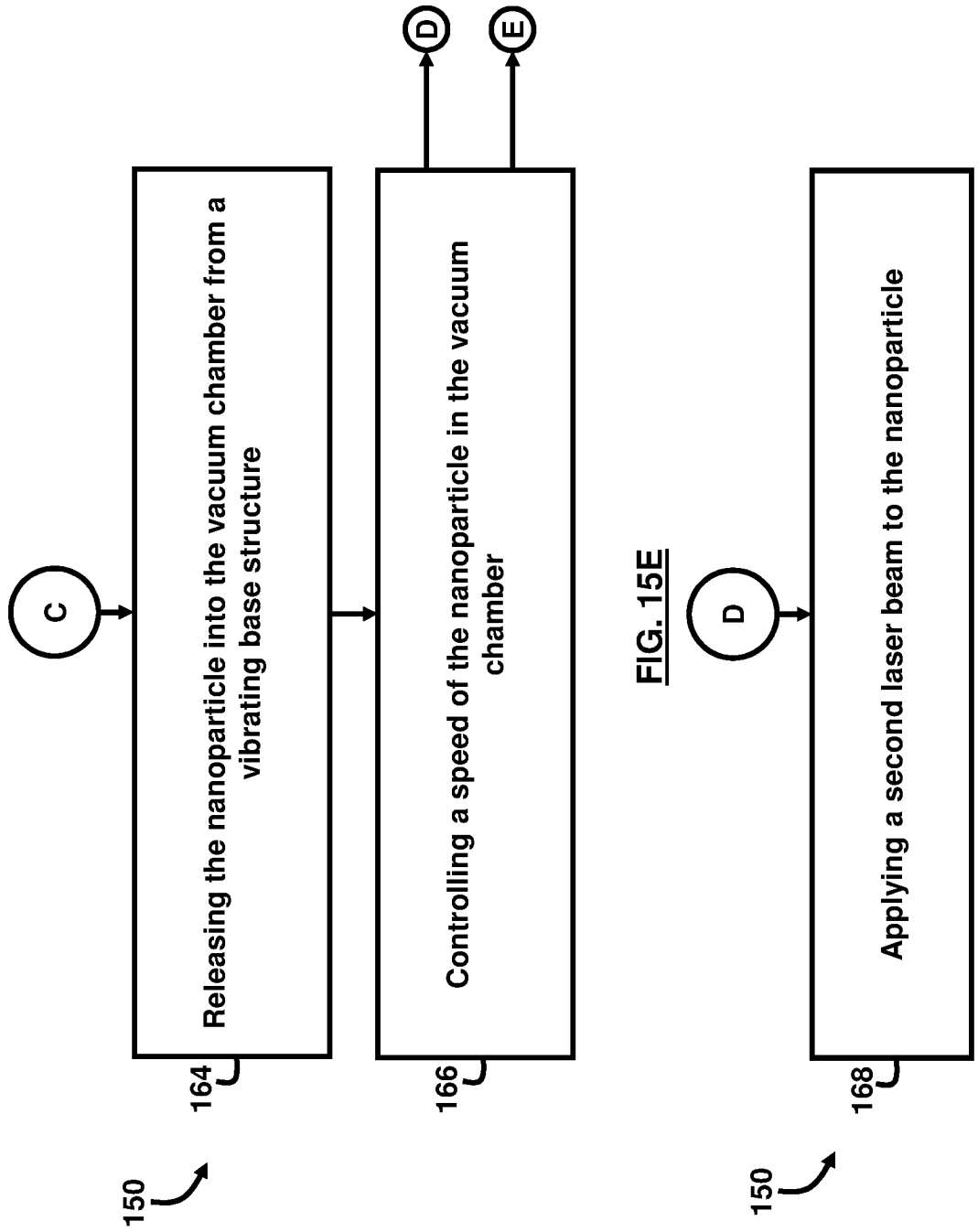

FIG. 15F

150 → 170: Applying a gas mixture to the nanoparticle as the nanoparticle is released from the vibrating base structure

FIG. 15G

150 → 172: Monitoring a movement of the nanoparticle in the vacuum chamber → 174: Controlling an energy level of the nanoparticle as the nanoparticle oscillates in the trap region

FIG. 15H

150 → 176: Measuring a center of the nanoparticle with respect to a center of the trap region ered by the Government of the United States for all
OPTICALLY LEVITATED NANOPARTICLE ACCELEROMETER

CROSS-REFERENCE TO RELATED APPLICATION(S)

This application claims the benefit of U.S. Provisional Patent Application No. 62/652,814 filed on Apr. 4, 2018, which is incorporated herein by reference in its entirety.

GOVERNMENT INTEREST

The invention described herein may be manufactured and used by or for the Government of the United States for all government purposes without the payment of any royalty.

BACKGROUND

Field of the Invention

The embodiments herein generally relate to optomechanics, and more particularly to techniques for capturing and measuring properties of optically levitated nanoparticles.

Background of the Invention

The use of optically levitated nanoparticles as force sensors has been the subject of academic research for the past 10 years. However, that research is generally limited to cases in which levitated nanoparticles are used as mechanical resonators. Developing the next generation of portable, high-precision accelerometers is currently a sought-after goal in industry. Portable, high-precision accelerometers and gyroscopes are a key component in defense systems such as guided missiles, particularly those designed to intercept fast-moving targets. They also provide an important alternative to GPS navigation for all types of craft in space, land, air, and sea. Accelerometers may be used with relative accuracy for motion sensing to detect and measure acceleration, angular velocity, etc. of devices in motion including relatively small devices such as smartphones. These measurements can identify the location or movement of the device. However, as devices decrease in size, the sensitivity of measuring the acceleration, etc. tends to decrease resulting in reduced accuracy. Therefore, a motion sensor that is adaptable for small and large-size devices is preferred particularly for applications involving high-precision motion and location detection requirements.

BRIEF SUMMARY OF THE INVENTION

In view of the foregoing, an embodiment herein provides an accelerometer comprising a vacuum chamber to receive a laser beam and a nanoparticle, wherein the nanoparticle is trapped in an oscillating state in a focus of the laser beam; and a processor to calculate an acceleration of the nanoparticle based on changes in position of an oscillating nanoparticle. The accelerometer may further comprise a plurality of photodetectors that are spaced apart to identify spatial coordinates of the oscillating nanoparticle. The processor may calculate the acceleration of the nanoparticle based on changes in the spatial coordinates of the oscillating nanoparticle and a frequency of oscillation of the nanoparticle within the vacuum chamber. The nanoparticle may comprise a diameter of a predetermined size and is trapped in the focus of the laser beam based on a polarizability of the nanoparticle. The diameter of the predetermined size of the nanoparticle may be smaller than a wavelength of the laser beam. The processor may comprise any of an integrated circuit, an application specific integrated circuit, field-programmable gate array, and a microcontroller.

Another embodiment provides a system comprising a laser source to generate a laser beam; a vacuum chamber comprising a levitating nanoparticle oscillating in a focus of the laser beam, wherein the nanoparticle scatters light; at least one sensor to detect a position of the nanoparticle by sensing an interference between light from the laser beam and the light scattered by the nanoparticle; and a processor to determine an acceleration of the nanoparticle based on a displacement in the position of the nanoparticle and a frequency of oscillation of the nanoparticle while the nanoparticle is oscillating in the focus of the laser beam. The at least one sensor may comprise an array of photodiode sensors to monitor the scattered light emitting from the nanoparticle and the light from the laser beam that is not scattered by the nanoparticle, and determine a three-dimensional motion of the nanoparticle while the nanoparticle is oscillating in the focus of the laser beam. The system may comprise a modulator to control an intensity of the laser beam. The system may comprise a base structure to initially hold the nanoparticle prior to introduction of the nanoparticle into the vacuum chamber; and a piezoelectric device operatively connected to the base structure to receive a voltage to cause the base structure to vibrate and transmit the nanoparticle into the vacuum chamber in an oscillating state. The system may comprise at least one lens to direct the focus of the laser beam in a defined trap region of the vacuum chamber. An electric field density in the trap region may be greater than the electric field density in areas outside of the trap region in the vacuum chamber.

Another embodiment provides a method of measuring an acceleration of a nanoparticle, the method comprising focusing a first laser beam in a vacuum chamber to define a trap region in the vacuum chamber; introducing a nanoparticle into the trap region; detecting positions of the nanoparticle as the nanoparticle oscillates in the trap region; and measuring an acceleration of the nanoparticle based on the detected positions and a frequency of oscillation of the nanoparticle. The introducing of the nanoparticle may comprise spraying an aerosol comprising the nanoparticle into the vacuum chamber. The introducing of the nanoparticle may comprise providing an inert gas comprising the nanoparticle into the vacuum chamber. The introducing of the nanoparticle may comprise releasing the nanoparticle into the vacuum chamber from a vibrating base structure; and controlling a speed of the nanoparticle in the vacuum chamber. Controlling the speed of the nanoparticle in the vacuum chamber may comprise applying a second laser beam to the nanoparticle. Controlling the speed of the nanoparticle in the vacuum chamber may comprise applying a gas mixture to the nanoparticle as the nanoparticle is released from the vibrating base structure. The method may comprise monitoring a movement of the nanoparticle in the vacuum chamber; and controlling an energy level of the nanoparticle as the nanoparticle oscillates in the trap region. The measuring of the acceleration of the nanoparticle based on the detected positions and the frequency of oscillation may comprise measuring a center of the nanoparticle with respect to a center of the trap region.

These and other aspects of the embodiments herein will be better appreciated and understood when considered in conjunction with the following description and the accompanying drawings. It should be understood, however, that the following descriptions, while indicating preferred embodiments and numerous specific details thereof, are given by way of illustration and not of limitation. Many changes and modifications may be made within the scope of the embodiments herein without departing from the spirit thereof, and the embodiments herein include all such modifications.

BRIEF DESCRIPTION OF THE DRAWINGS

The embodiments herein will be better understood from the following detailed description with reference to the drawings, in which:

FIG. 14 is a schematic block diagram illustrating applying a second laser beam to a nanoparticle of the system of FIG. 7, according to an example herein;

FIG. 15A is a flow diagram illustrating a method of measuring an acceleration of a nanoparticle, according to an embodiment herein;

FIG. 15B is a flow diagram illustrating a first method of introducing a nanoparticle into a trap region in a vacuum chamber, according to an embodiment herein;

FIG. 15C is a flow diagram illustrating a second method of introducing a nanoparticle into a trap region in a vacuum chamber, according to an embodiment herein;

FIG. 15D is a flow diagram illustrating a third method of introducing a nanoparticle into a trap region in a vacuum chamber, according to an embodiment herein;

FIG. 15E is a flow diagram illustrating a first method of controlling the speed of a nanoparticle, according to an embodiment herein;

FIG. 15F is a flow diagram illustrating a second method of controlling the speed of a nanoparticle, according to an embodiment herein;

FIG. 15G is a flow diagram illustrating a method of monitoring and controlling a nanoparticle, according to an embodiment herein; and FIG. 15H is a flow diagram illustrating a method of measuring the acceleration of a nanoparticle, according to an embodiment herein.

DETAILED DESCRIPTION OF THE INVENTION

Figure 1:
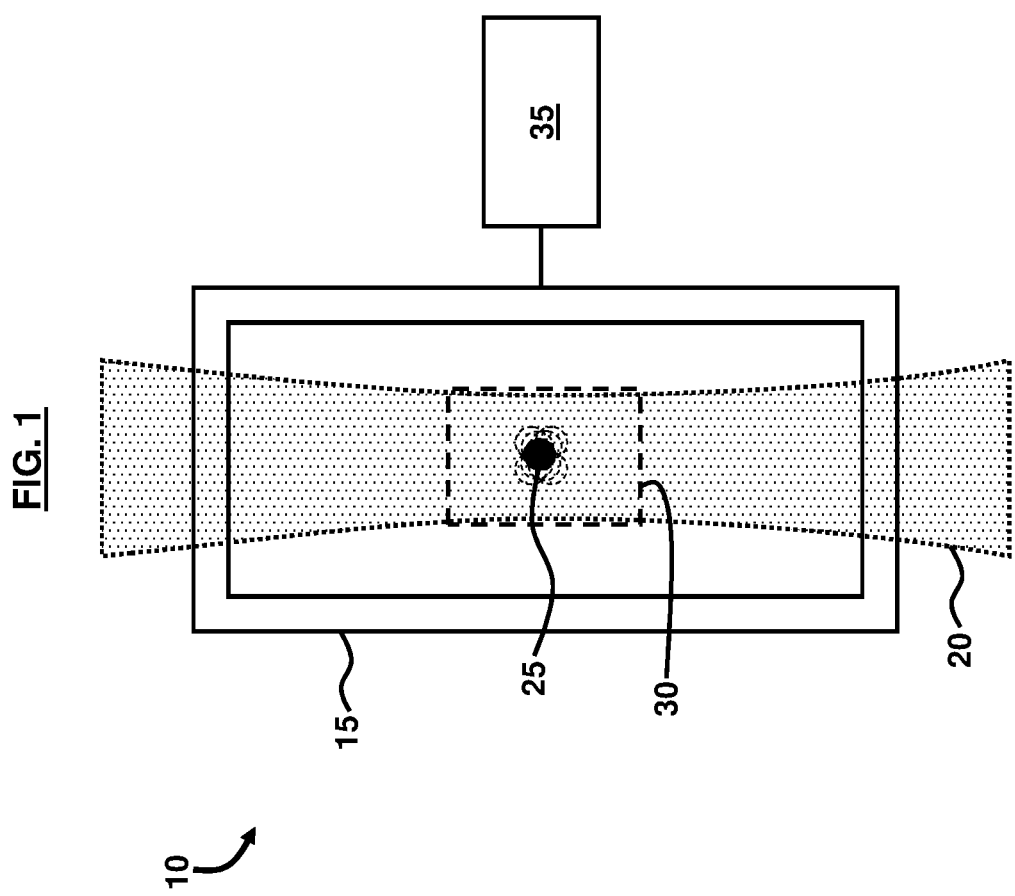
FIG. 1 is a schematic block diagram illustrating an accelerometer to calculate an acceleration of a nanoparticle, according to an embodiment herein.

Embodiments of the disclosed invention, its various features and the advantageous details thereof, are explained more fully with reference to the non-limiting embodiments that are illustrated in the accompanying drawings and detailed in the following description. Descriptions of well-known components and processing techniques are omitted to not unnecessarily obscure what is being disclosed. Examples may be provided and when so provided are intended merely to facilitate an understanding of the ways in which the invention may be practiced and to further enable those of skill in the art to practice its various embodiments. Accordingly, examples should not be construed as limiting the scope of what is disclosed and otherwise claimed.

The embodiments herein utilize optically levitated nanoparticles for inertial sensing to continuously and directly measure inertial and gravitational forces. An example provides an accelerometer that measures acceleration by observing the displacement and the frequency of oscillation of a nanoparticle within a trap comprising a focused laser beam that suspends or traps the nanoparticle in a vacuum chamber. When the trapping apparatus is accelerated, the nanoparticle displaces within the trap due to its own inertia. The nanoparticle is introduced into the vacuum chamber using different techniques including an aerosol spray containing the nanoparticle, launching the nanoparticle in a buffered/inert gas such as $N_2Ar$, or launching the nanoparticle from a vibrating glass slide. The oscillation of the nanoparticle in the vacuum chamber is controlled using a "cooling" technique, which involves modulating the power of the laser beam to retain the nanoparticle within the trap region of the vacuum chamber.

Referring now to the drawings, and more particularly to FIGS. 1 through 15H, where similar reference characters denote corresponding features consistently throughout, there are shown exemplary embodiments. In the drawings, the size and relative sizes of components, layers, and regions may be exaggerated for clarity.

FIG. 1 illustrates an accelerometer 10 comprising a vacuum chamber 15 to receive a laser beam 20 and a nanoparticle 25, wherein the nanoparticle 25 is trapped in an oscillating state in a focus 30 of the laser beam 20. According to some examples, the laser beam 20 may comprise any suitable wavelength of light such as 532 nm, 1064 nm, and 1550 nm, although other suitable wavelengths may be utilized in accordance with the embodiments herein. The nanoparticle 25 may comprise various materials such as silica, silicon, or diamond, for example, and may have some non-zero polarizability and therefore is attracted to regions of higher electric field density; i.e. the center of the focus 30 of the laser beam 20. Thus, the nanoparticle 25 is "levitated", or held in space by the laser beam 20. As such, the laser beam 20 is focused to a point in space; e.g., the focus 30, in the vacuum chamber 15 in order to levitate the nanoparticle 25. Accordingly, the focus 30 may be considered as an optical dipole trap for holding the suspended nanoparticle 25. The nanoparticle 25 may be trapped by a single laser beam 20 regardless of the gravitational field. Because the nanoparticle 25 is smaller than the wavelength of light, it does not reflect light like microspheres, and instead the nanoparticle 25 is attracted to the focus 30 of the laser beam 20 by virtue of the polarizability of the nanoparticle 25. Furthermore, the vacuum chamber 15 is not restricted to a high vacuum environment so long as the nanoparticle 25 is not disturbed by collisions with air molecules.

A processor 35 is provided to calculate an acceleration of the nanoparticle 25 based on changes in position of an oscillating nanoparticle 25. In an example, the position of the nanoparticle 25 within the trap; e.g., the focus 30 of the laser beam 20, can be continuously monitored using image detection and processing techniques, which are further described below. Moreover, the nanoparticle 25 constantly scatters light from the trapping laser beam 20 in the form of spherical waves; i.e., photons traveling away from the nanoparticle 25 in random directions.

In some examples, the processor 35 described herein and/or illustrated in the figures may include hardware-enabled modules and may include a plurality of overlapping or independent electronic circuits, devices, and discrete elements packaged onto a circuit board to provide data and signal processing functionality within a computer. An example might be a comparator, inverter, or flip-flop, which could include a plurality of transistors and other supporting devices and circuit elements. The modules that include electronic circuits may process computer logic instructions capable of providing digital and/or analog signals for performing various functions as described herein. The various functions can further be physically saved as any of data structures, data paths, data objects, data object models, object files, and database components. For example, the data objects could include a digital packet of structured data. The data structures could include any of an array, tuple, map, union, variant, set, graph, tree, node, and an object, which may be stored and retrieved by computer memory and may be managed by processors, compilers, and other computer hardware components. The data paths may be part of a computer CPU that performs operations and calculations as instructed by the computer logic instructions. The data paths could include digital electronic circuits, multipliers, registers, and buses capable of performing data processing operations and arithmetic operations (e.g., Add, Subtract, etc.), bitwise logical operations (AND, OR, XOR, etc.), bit shift operations (e.g., arithmetic, logical, rotate, etc.), and complex operations (e.g., using single clock calculations, sequential calculations, iterative calculations, etc.). The data objects may be physical locations in computer memory and can be a variable data object, a data structure, or a function. In an example of a relational database, the data objects can be set as a table or column. Other implementations include specialized objects, distributed objects, object-oriented programming objects, and semantic web objects, for example. Furthermore, the data object models can be set as an application programming interface for creating HyperText Markup Language (HTML) and Extensible Markup Language (XML) electronic documents. The models can be further set as any of a tree, graph, container, list, map, queue, set, stack, and variations thereof, according to various examples. The data object files may be created by compilers and assemblers and may contain generated binary code and data for a source file. The database components can include any of tables, indexes, views, stored procedures, and triggers.

The accelerometer 10 may be used by itself for inertial sensing, however an array of accelerometers 10 positioned at known distances from one another could form a gravity gradiometer, which may be used in navigation to detect the direction of gravitational attraction to the Earth. Other uses for the high-sensitivity accelerometer 10 include monitoring the motion of the Earth and its tectonic plates, prospecting for oil and minerals, detecting tunnels underground, and monitoring the motion of people or objects behind barriers.

Figure 2:
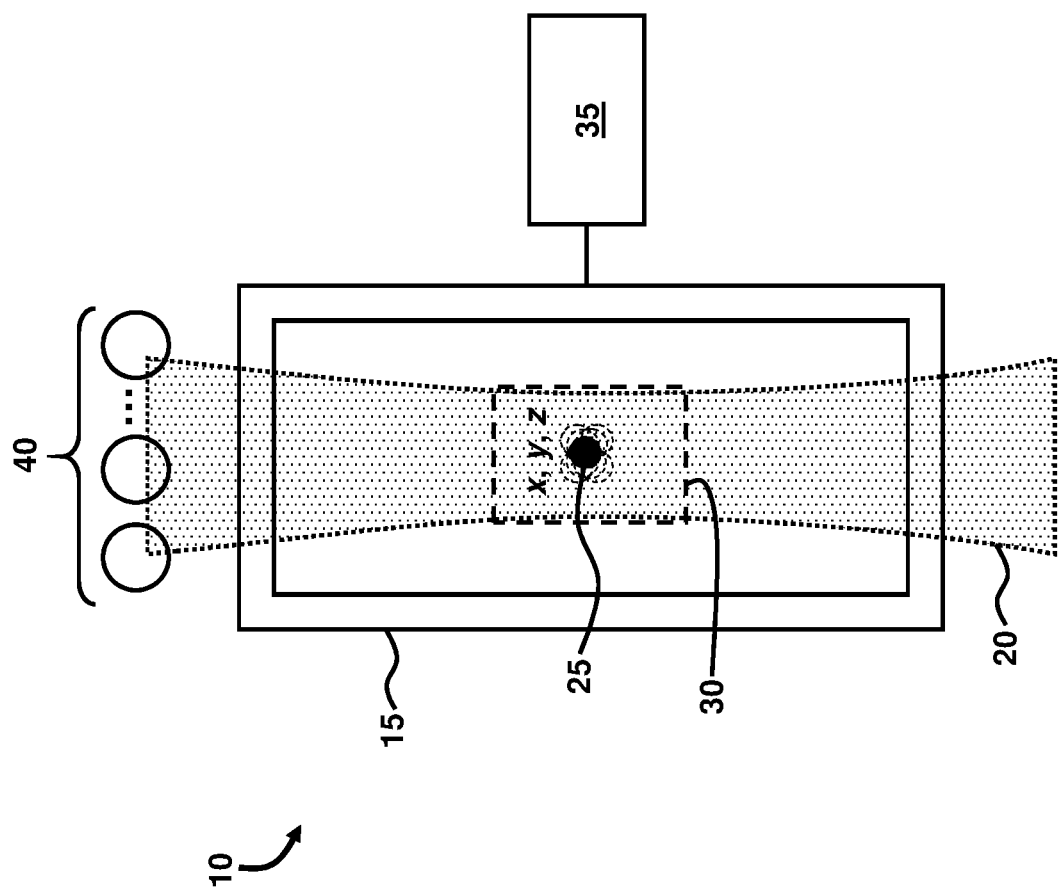
FIG. 2 is a schematic block diagram illustrating the accelerometer with a plurality of photodetectors of FIG. 1, according to an embodiment herein.

FIG. 2, with reference to FIG. 1, illustrates that the accelerometer 10 may further comprise a plurality of photodetectors 40 that are spaced apart to identify spatial coordinates x, y, z of the oscillating nanoparticle 25. The plurality of photodetectors 40 may be positioned within the trapping laser beam 20 to measure the sum of the scattered and non-scattered light, which depends on the relative phases of the two. The phase of the non-scattered light is nominally constant, while the phase of the scattered light depends on the position of the nanoparticle 25. Therefore, by measuring the relative phase of the two signals, the plurality of photodetectors 40 constantly measures the distance between itself and the nanoparticle 25. Accordingly, an array of the plurality of photodetectors 40 at different positions can track the motion of the nanoparticle 25 in three-dimensions and remove errors associated with fluctuations in the non-scattered light phase.

Figure 3:
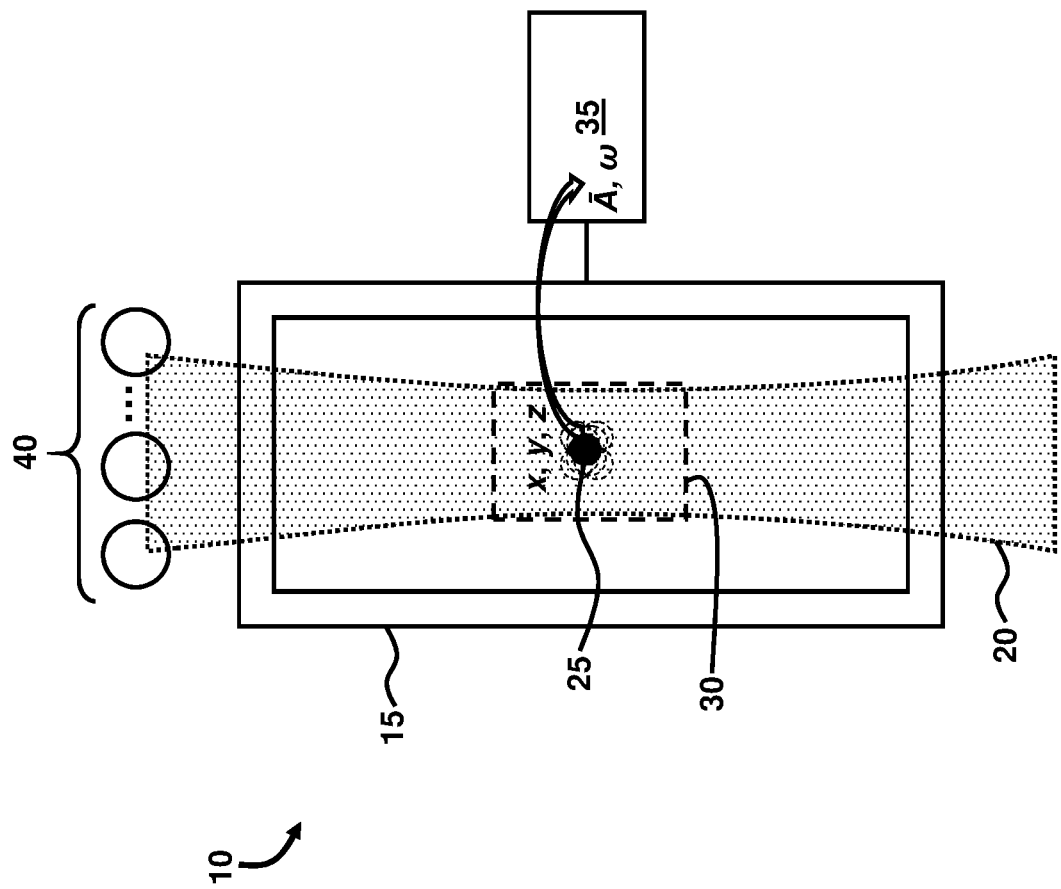
FIG. 3 is a schematic block diagram illustrating a technique for calculating the acceleration of a nanoparticle in the accelerometer of FIG. 1, according to an embodiment herein.

FIG. 3, with reference to FIGS. 1 and 2, illustrates that the processor 35 may calculate the acceleration A of the nanoparticle 25 based on changes in the spatial coordinates x, y, z of the oscillating nanoparticle 25 and a frequency co of oscillation of the nanoparticle 25 within the vacuum chamber 15. The levitated nanoparticle 25 is constantly subjected to motional cooling. There are many effects which may cause the nanoparticle 25 to gain motional energy and, if left unchecked, oscillate with greater amplitude within the focus 30 of the laser beam 20 such as vibrational motion of the laser beam 20, fluctuations in the intensity of the laser beam 20, collisions between the nanoparticle 25 and background gas within the vacuum chamber 15, and the momentum kicks associated with the absorption and re-emission of photons of the nanoparticle 25 from the trapping laser beam 20, among other effects, according to some examples. Therefore, the oscillation of the nanoparticle 25 is damped. One way to accomplish this is using Sisyphus cooling, for example, which is a type of laser cooling involving shining interfering laser beams on an atom sample. When the nanoparticle 25 moves toward its center of oscillation, the strength of the focus 30 of the laser beam 20 is decreased. This causes the nanoparticle 25 to gain less kinetic energy traveling toward its center of oscillation then it spent moving away from its center of oscillation. Thus, the nanoparticle 25 constantly loses motional energy. Eventually, some energy equilibrium is reached that depends on the characteristics of the heating effects and, in very low-energy cases, quantum mechanical limitations.

Figure 4:
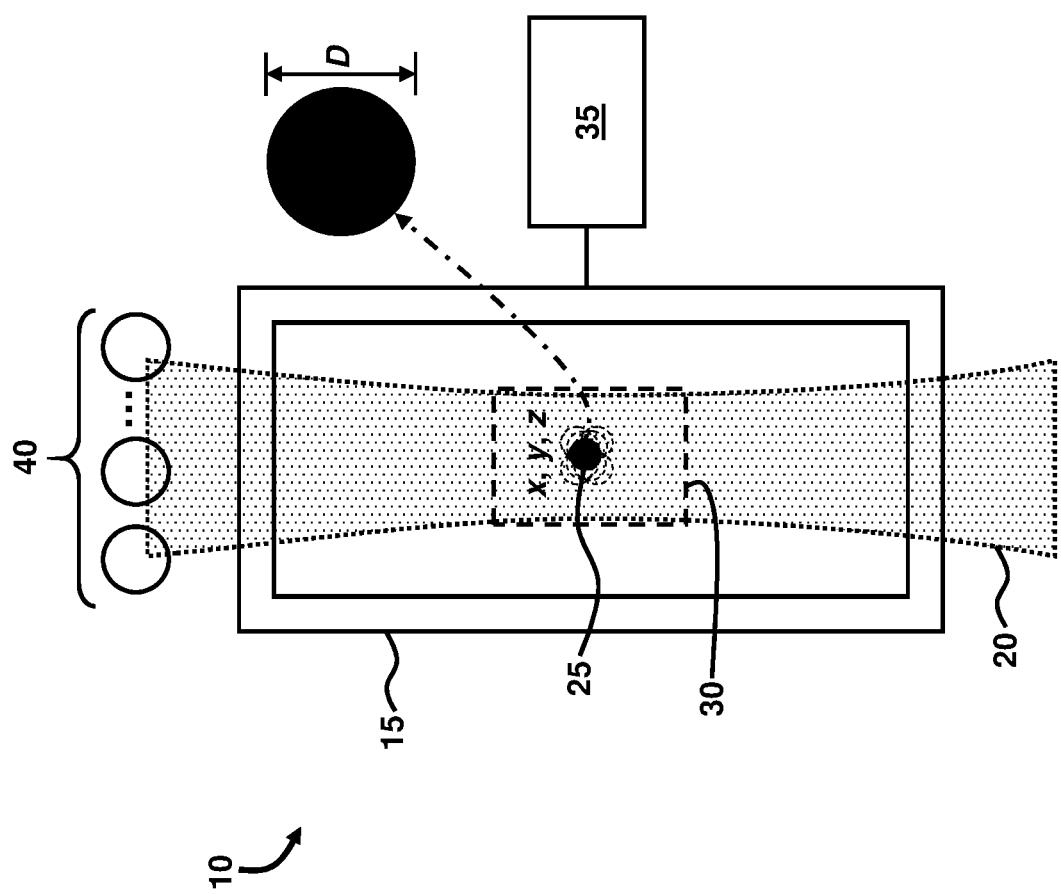
FIG. 4 is a schematic block diagram illustrating aspects of the nanoparticle in the accelerometer of FIG. 1, according to an embodiment herein.
Figure 5:
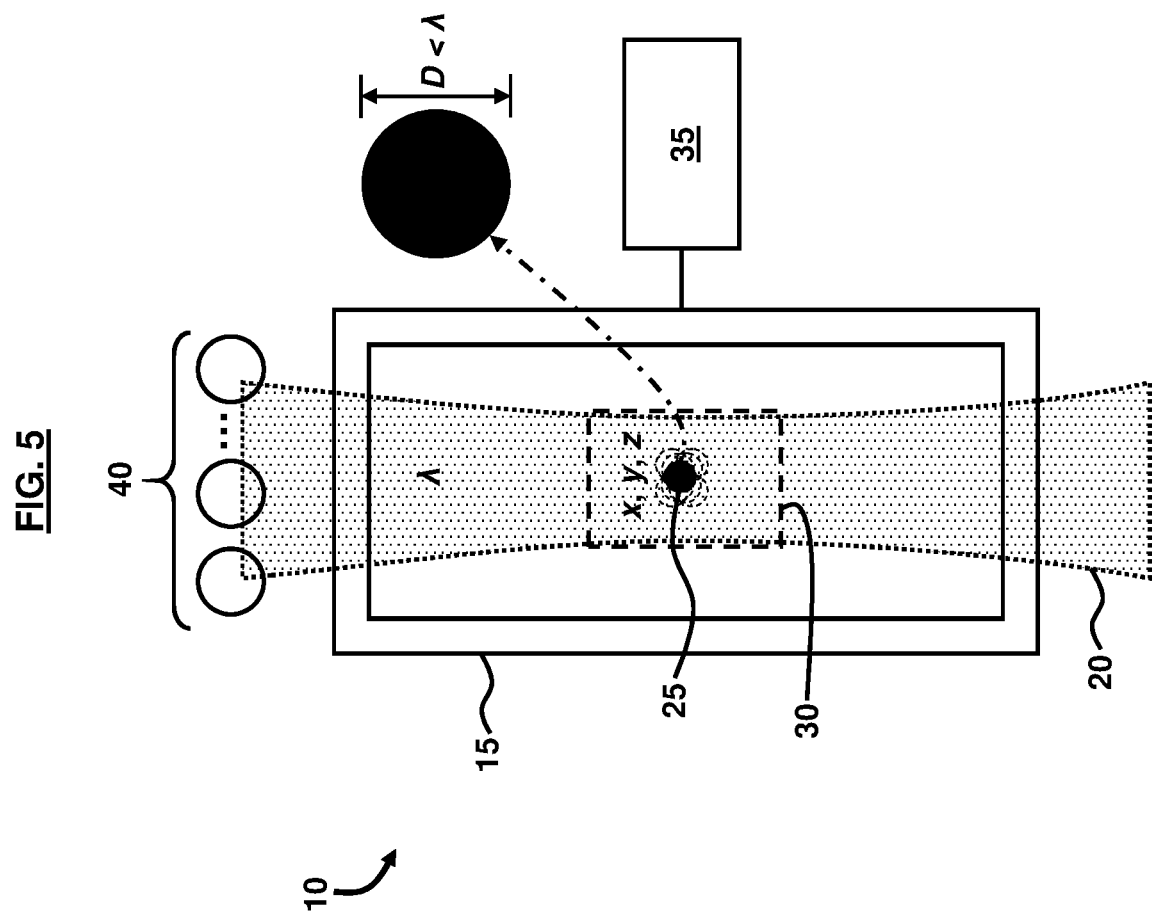
FIG. 5 is a schematic block diagram illustrating further aspects of the nanoparticle in the accelerometer of FIG. 1, according to an embodiment herein.

FIG. 4, with reference to FIGS. 1 through 3, illustrates that the nanoparticle 25 may comprise a diameter D of a predetermined size and is trapped in the focus 30 of the laser beam 20 based on a polarizability of the nanoparticle 25. In an example, the nanoparticle 25 may be a sub-wavelength-sized particle, although any suitably-sized diameter D of the nanoparticle 25 may be used in accordance with the embodiments herein. FIG. 5, with reference to FIGS. 1 through 4, illustrates that the diameter D of the predetermined size of the nanoparticle 25 may be smaller than a wavelength λ of the laser beam 20. For example, the diameter D of the nanoparticle 25 may be smaller than the chosen wavelength λ of the laser beam 20; for example, around 100-200 nm.

Figure 6:
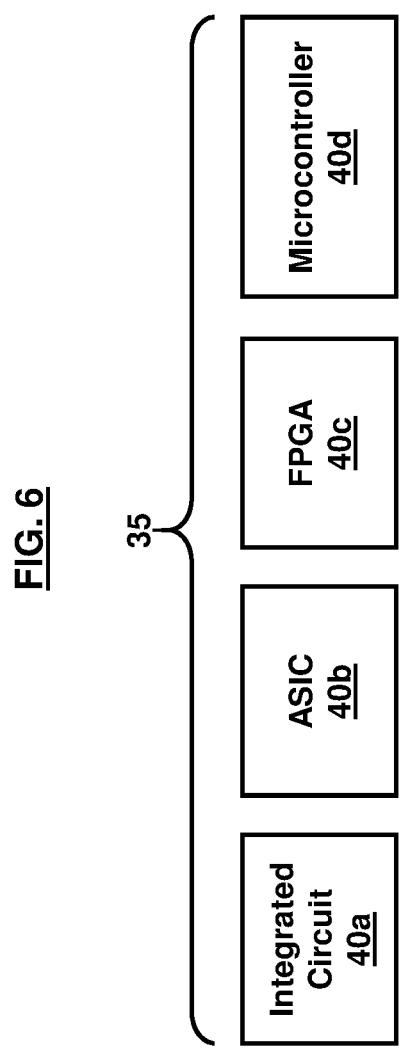
FIG. 6 is schematic block diagram illustrating different aspects of the processor of the accelerometer of FIG. 1, according to an embodiment herein.

FIG. 6, with reference to FIGS. 1 through 5, illustrates that the processor 35 may comprise any of an integrated circuit 40a, an application specific integrated circuit (ASIC) 40b, field-programmable gate array (FPGA) 40c, and a microcontroller 40d according to exemplary embodiments. In some examples, the processor 35 may comprise a central processing unit (CPU) of an associated computing device, not shown. In other examples the processor 35 may be a discrete component independent of other processing components in the associated computing device. In other examples, the processor 35 may be a microprocessor, microcontroller, hardware engine, hardware pipeline, and/or other hardware-enabled device suitable for receiving, processing, operating, and performing various functions required by the associated computing device. The processor 35 may be provided in the associated computing device, coupled to the associated computing device, or communicatively linked to the associated computing device from a remote networked location, according to various examples.

Figure 7:
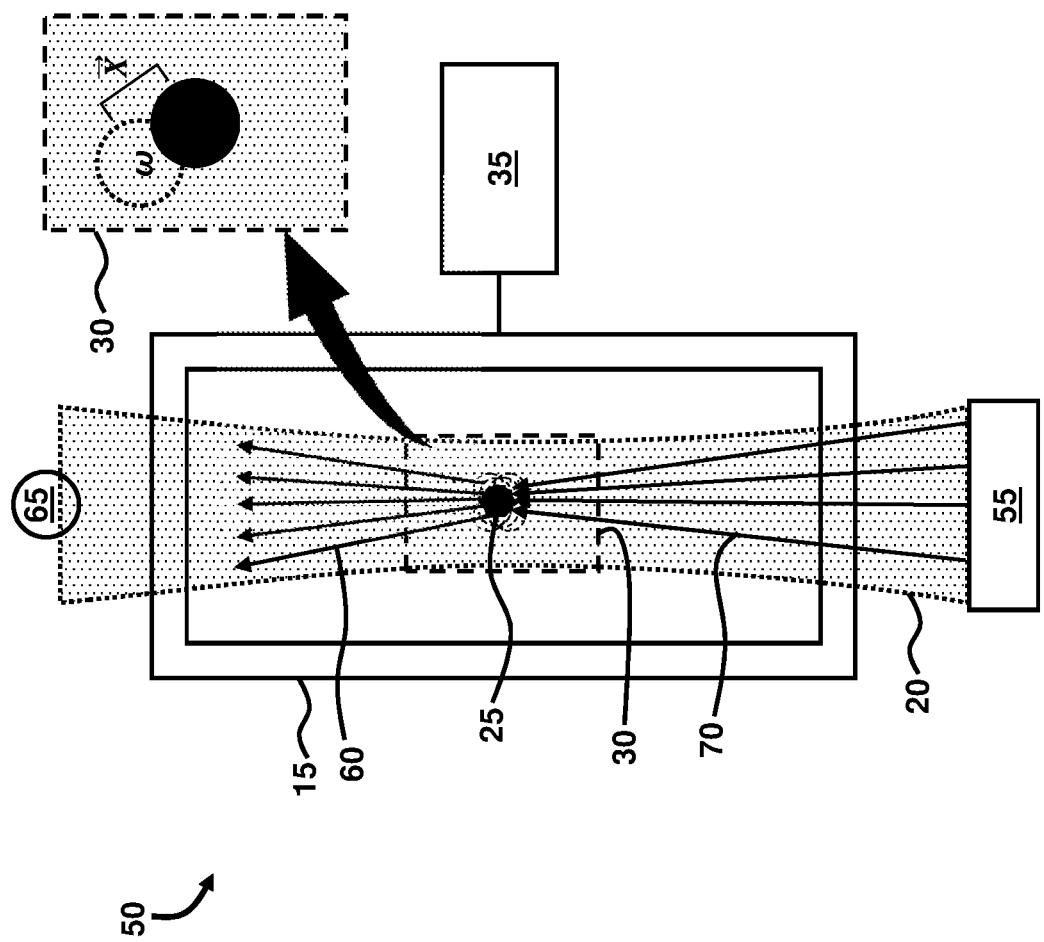
FIG. 7 is a schematic block diagram illustrating a system to determine an acceleration of a nanoparticle, according to an embodiment herein.

FIG. 7, with reference to FIGS. 1 through 6, illustrates a system 50 comprising a laser source 55 to generate a laser beam 20. A vacuum chamber 15 is provided comprising a levitating nanoparticle 25 oscillating in a focus 30 of the laser beam 20. The nanoparticle 25 scatters light 60. At least one sensor 65 is provided to detect a position of the nanoparticle 25 by sensing an interference between light 70 from the laser beam 20 and the light 60 scattered by the nanoparticle 25. A processor 35 is provided to determine an acceleration of the nanoparticle 25 based on a displacement $\vec{X}$ in the position of the nanoparticle 25 and a frequency ω of oscillation of the nanoparticle 25 while the nanoparticle 25 is oscillating in the focus 30 of the laser beam 20.

As described above, according to some examples, the laser beam 20 may comprise any suitable wavelength of light such as 532 nm, 1064 nm, and 1550 nm, although other suitable wavelengths may be utilized in accordance with the embodiments herein. The nanoparticle 25 may comprise various materials such as silica, silicon, or diamond, for example, and may have some non-zero polarizability and therefore is attracted to regions of higher electric field density; i.e. the center of the focus 30 of the laser beam 20. Thus, the nanoparticle 25 is "levitated", or held in space by the laser beam 20. As such, the laser beam 20 is focused to a point in space; e.g., the focus 30, in the vacuum chamber 15 in order to levitate the nanoparticle 25. Accordingly, the focus 30 may be considered as an optical dipole trap for holding the suspended nanoparticle 25. The vacuum chamber 15 is not restricted to a high vacuum environment so long as the nanoparticle 25 is not disturbed by collisions with air molecules.

The trapping potential of the laser beam 20 appears approximately quadratic to the nanoparticle 25:

$$V_{trap} = \frac{1}{2}k|\vec{x}|^2 \qquad (1)$$

where k is the spring constant of the trap (e.g., focus 30 of the laser beam 20), and $\vec{x}$ is the vector pointing from the center of the trap (e.g., focus 30 of the laser beam 20) to the position of the nanoparticle 25. Equation (1) is approximately true so long as the position of the nanoparticle 25 obeys the following characteristics:

$$r < \frac{\omega_0}{4} \qquad (2)$$

$$z < \frac{z_R}{4} \qquad (3)$$

where r and z are the polar coordinates representing $\vec{x}$ (z is the coordinate along the axis of the laser beam 20), Wo is the Gaussian beam waist, and $z_R$ is the Rayleigh range of the laser beam 20.

An inertial or gravitational acceleration d can be expressed as a linear potential:

$$V_{accel} = -m\vec{a} \cdot \vec{x} \qquad (4)$$

where m is the mass of the nanoparticle 25 (~$10^{-18}$ kg). The total potential affecting the nanoparticle 25 is $V=V_{trap}+V_{accel}$. The total force on the nanoparticle 25 is therefore expressed as:

$$\vec{F} = -\left(\frac{dV}{dx}\hat{x} + \frac{dV}{dy}\hat{y} + \frac{dV}{dz}\hat{z}\right) = -k\vec{x} + m\vec{a} \qquad (5)$$

The center of the oscillation of the nanoparticle 25, $\vec{x}_0$, occurs at the $\vec{x}$ where $\vec{F}=0$. Therefore, the acceleration experienced by the nanoparticle 25 is proportional to the displacement of its center of oscillation from the center of the optical trap (e.g., focus 30 of the laser beam 20):

$$\vec{a} = \frac{k}{m}\vec{x}_0 = \omega^2\vec{x}_0 \qquad (6)$$

where ω/(2π) is the frequency of oscillation of the nanoparticle 25.

Thus, the acceleration experienced by the nanoparticle 25 can be continuously measured by continuously measuring ω and $\vec{x}_0$. Moreover, $\vec{x}_0$ can be determined by finding the time average of $\vec{x}(t)$, and ω can be determined by finding peaks in the Fourier transform of $\vec{x}(t)$. Alternatively, ω and $\vec{x}_0$ can be determined simultaneously by fitting sine waves to the x, y, and z positions of the nanoparticle 25.

The sensitivity of an acceleration measurement is a measure of how precisely acceleration can be measured given a specified amount of data acquisition time. Acceleration sensitivity $S_a$ is defined as $\sigma_a\sqrt{T}$, where $\sigma_a$ is the statistical error on a measurement and T is the time it took to make that measurement (lower values of $S_a$ are better). It is known from Equation (6) that an uncertainty in $\vec{x}_0$ will yield an uncertainty in acceleration as provided by:

$$\sigma_{\vec{a}} = \omega^2 \sigma_{\vec{x}_0} \qquad (7)$$

Each side of Equation (7) can be multiplied by $\sqrt{T}$ to yield the following expression:

$$S_{\vec{a}} = \omega^2 S_{\vec{x}_0} \quad (8)$$

Industry-reported position sensitivities $S_{\vec{x}_0}$ are on the order of $10^{-12}$ to $10^{-14}$ m/$\sqrt{Hz}$. It can be seen from Equation (8) that lower oscillation frequencies result in better acceleration sensitivities.

One aspect to this concept is that the acceleration can be computed entirely using quantities that are measured in real-time: $\omega$ and $\vec{x}_0$. Specifically, there are no quantities such as the mass of the nanoparticle 25 or the size of the optical trap (e.g., focus 30 of the laser beam 20) which, if not known with high accuracy, would limit the overall accuracy of the accelerometer 10 or system 50.

Another aspect of the embodiments herein is that the sensitivity and dynamic range of the accelerometer 10 or system 50 can be tuned in real-time depending on the motion and sensitivity requirements of a particular device (e.g., a vehicle, machine, apparatus, etc.) to which the accelerometer 10 or system 50 could be attached. The dynamic range is the range of minimum to maximum accelerations that the attached device can measure. The frequency of oscillation, which is proportional to the sensitivity, is given by the following equation:

$$\omega^2 = \left(\frac{16\lambda^2 P}{\pi^2 c \rho \omega_0^6}\right)\left(\frac{n^2 - 1}{n^2 + 2}\right) \quad (9)$$

and that maximum detectable acceleration $a_{max}$ is equal to:

$$a_{max}\left(\frac{4\lambda P}{\pi c \rho \omega_0^4}\right)\left(\frac{n^2 - 1}{n^2 + 2}\right) \quad (10)$$

where $\lambda$ is the wavelength of the laser light 70, P is the laser power, c is the speed of light, $\rho$ is the density of the nanoparticle 25, and n is the index of refraction of the material that makes up the nanoparticle 25. These equations show that, by adjusting the laser power P and the Gaussian beam waist coo in real-time, one can select combinations of sensitivity and dynamic range that best suit the particular application for which the accelerometer 10 and/or system 50 are to be implemented.

Figure 8:
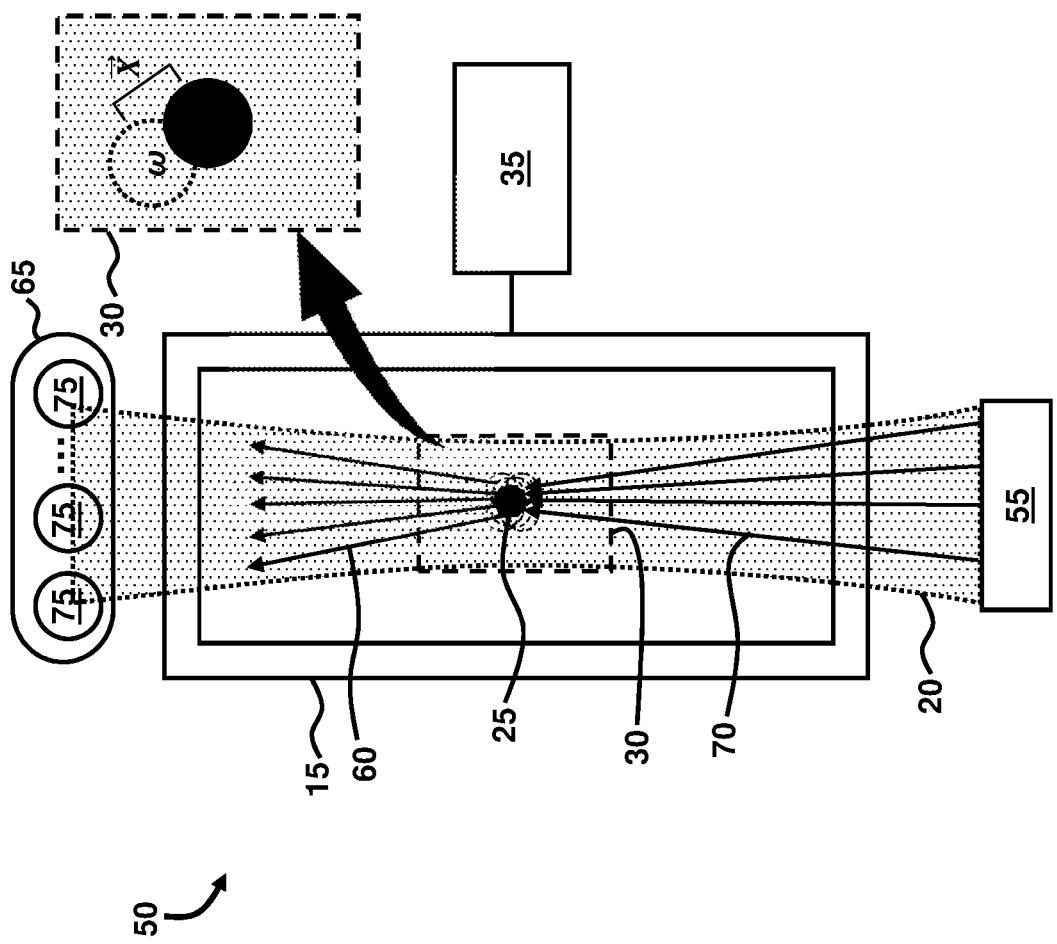
FIG. 8 is a schematic block diagram illustrating an array of photodiode sensor in the system of FIG. 7, according to an embodiment herein.

FIG. 8, with reference to FIGS. 1 through 7, illustrates that the at least one sensor 65 may comprise an array of photodiode sensors 75 to monitor the scattered light 60 emitting from the nanoparticle 25 and the light 70 from the laser beam 20 that is not scattered by the nanoparticle 25, and determine a three-dimensional motion of the nanoparticle 25 while the nanoparticle 25 is oscillating in the focus 30 of the laser beam 20. The array of photodiode sensors 75 may comprise any suitable type of photodiode device or devices capable of monitoring the scattered light 60, and accordingly, the array of photodiode sensors 75 may be arranged in any suitable arrangement to properly detect and monitor the scattered light 60. In an example, the array of photodiode sensors 75 may be communicatively coupled to the processor 35 to provide real-time image processing of the scattered light 60 by the processor 35.

Figure 9:
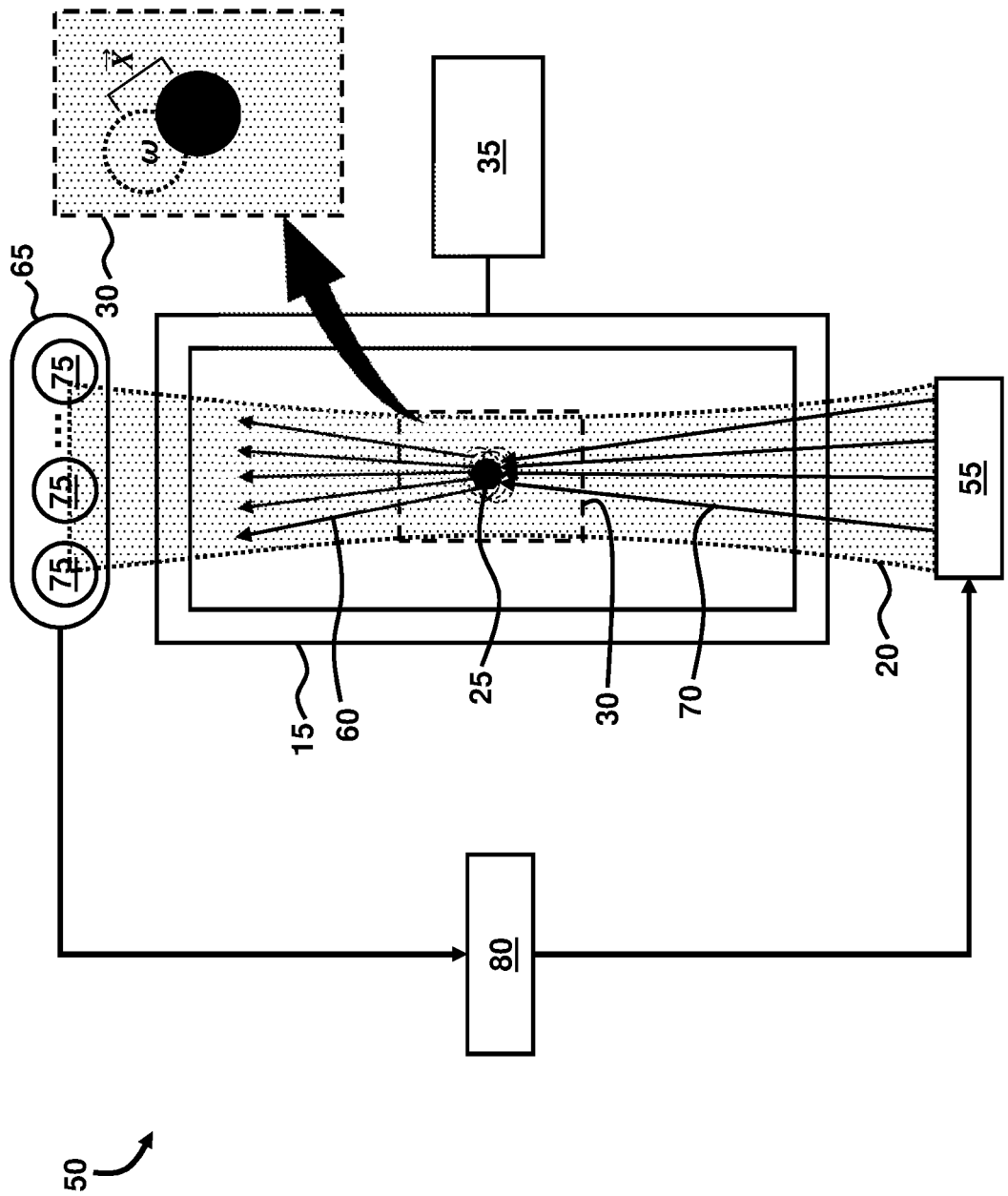
FIG. 9 is a schematic block diagram illustrating a modulator in the system of FIG. 7, according to an embodiment herein.

FIG. 9, with reference to FIGS. 1 through 8, illustrates that the system 50 may comprise a modulator 80 to control an intensity of the laser beam 20. According to some examples, the modulator 80 may be a stand-alone device to modulate or control the intensity of the laser beam 20, or the modulator 80 may be configured as part of the laser source emitting the laser beam 20. Furthermore, the modulator 80 may provide for a "cooling" technique, as further described below, to help control the speed of the nanoparticle 25 upon entering the vacuum chamber 15.

Figure 10:
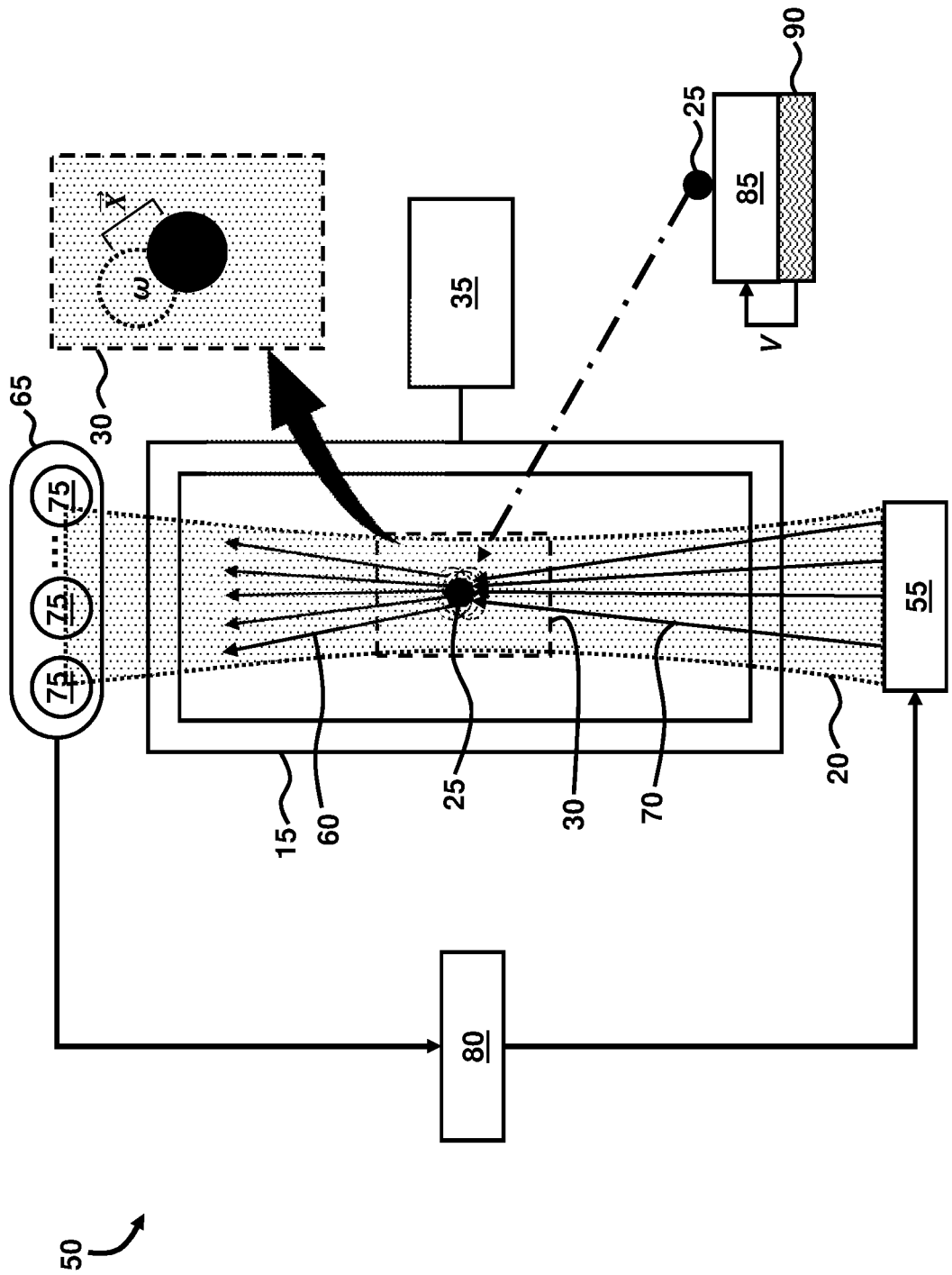
FIG. 10 is a schematic block diagram illustrating a base structure and a piezoelectric device used to transmit the nanoparticle in the system of FIG. 7, according to an embodiment herein.
Figure 11:
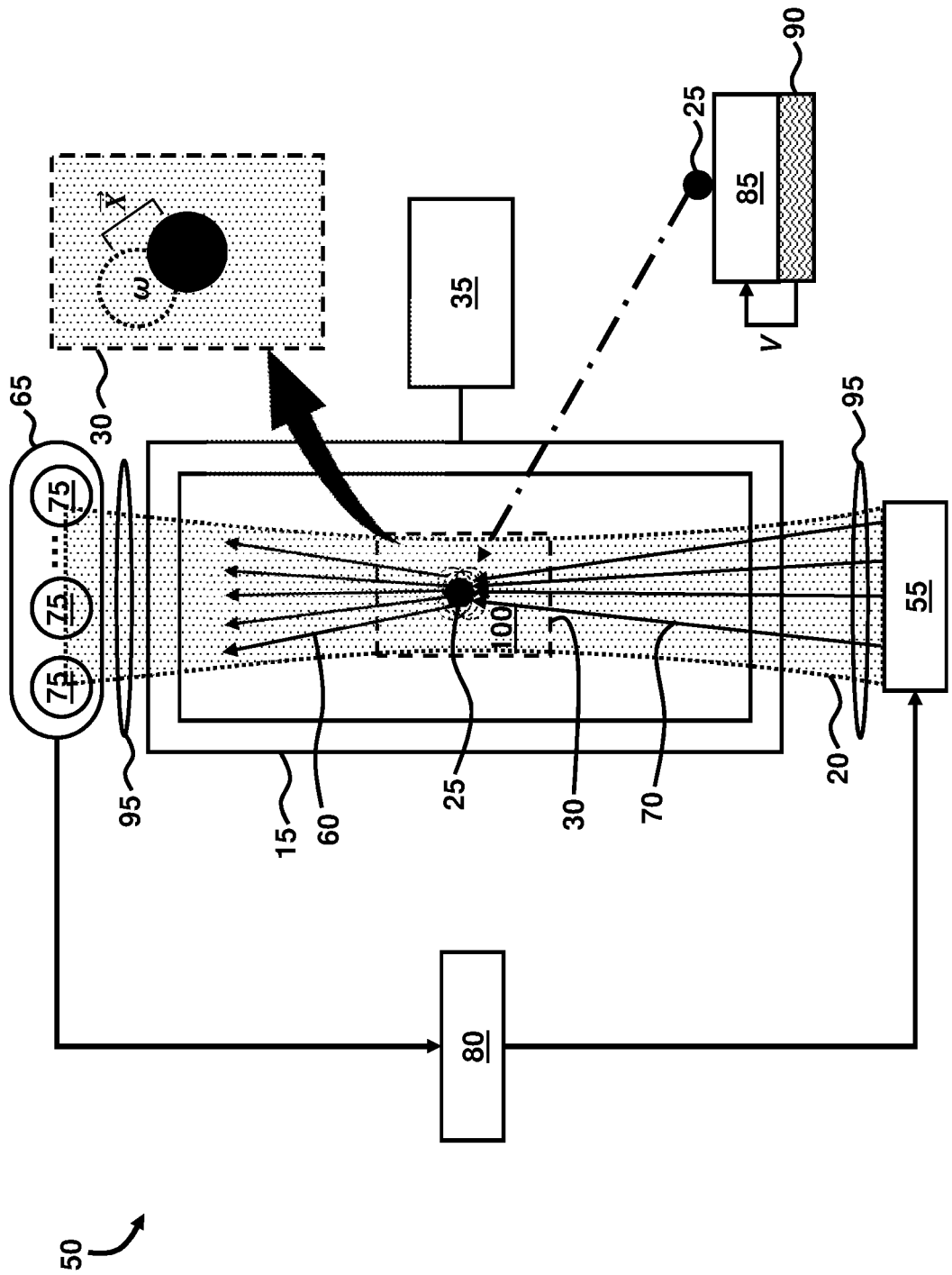
FIG. 11 is a schematic block diagram illustrating a lens in the system of FIG. 7, according to an embodiment herein.
Figure 12:
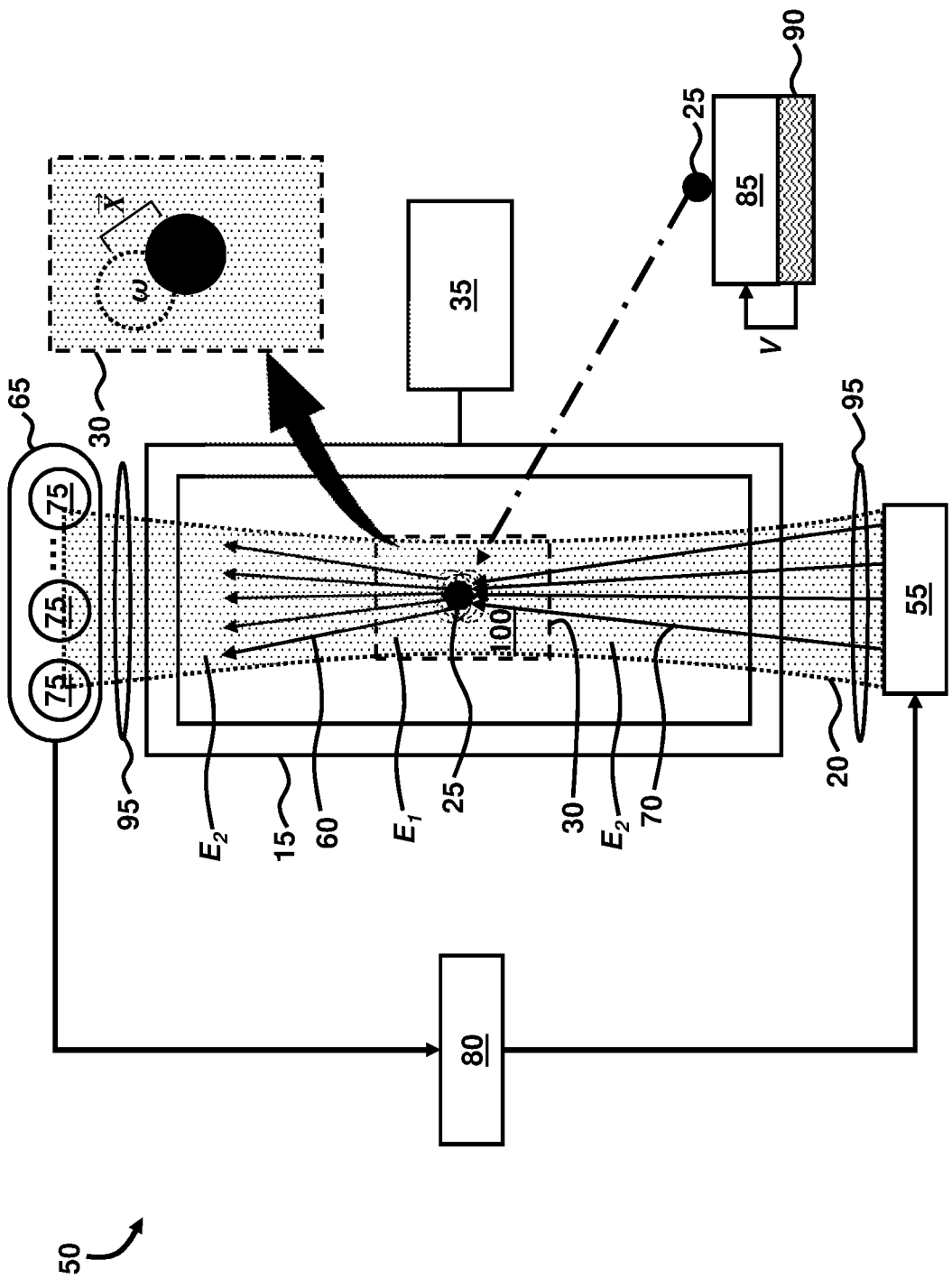
FIG. 12 is a schematic block diagram illustrating aspects of the trap region in the system of FIG. 7, according to an embodiment herein.
Figure 13A:
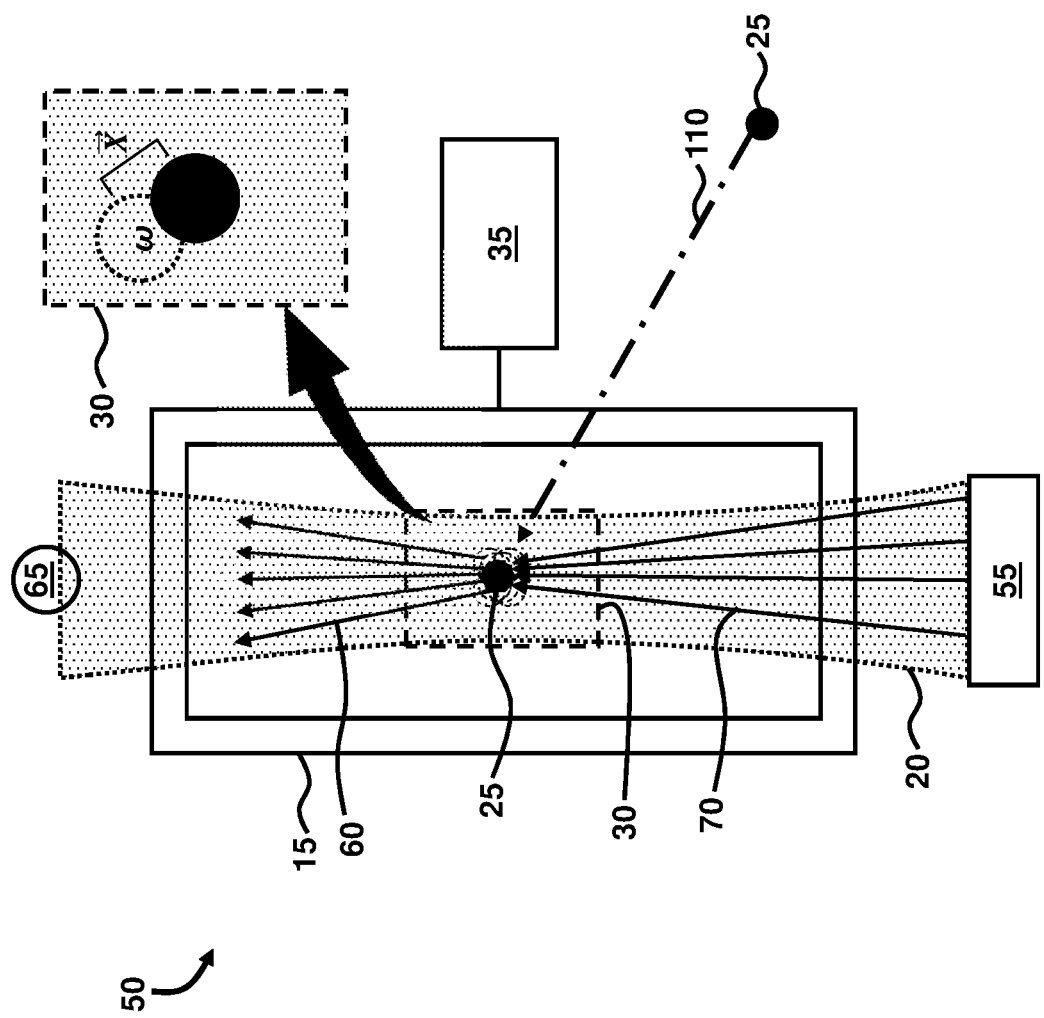
FIG. 13A is a schematic block diagram illustrating introducing a nanoparticle into the vacuum chamber of the system of FIG. 7 by spraying an aerosol, according to an embodiment herein.
Figure 13B:
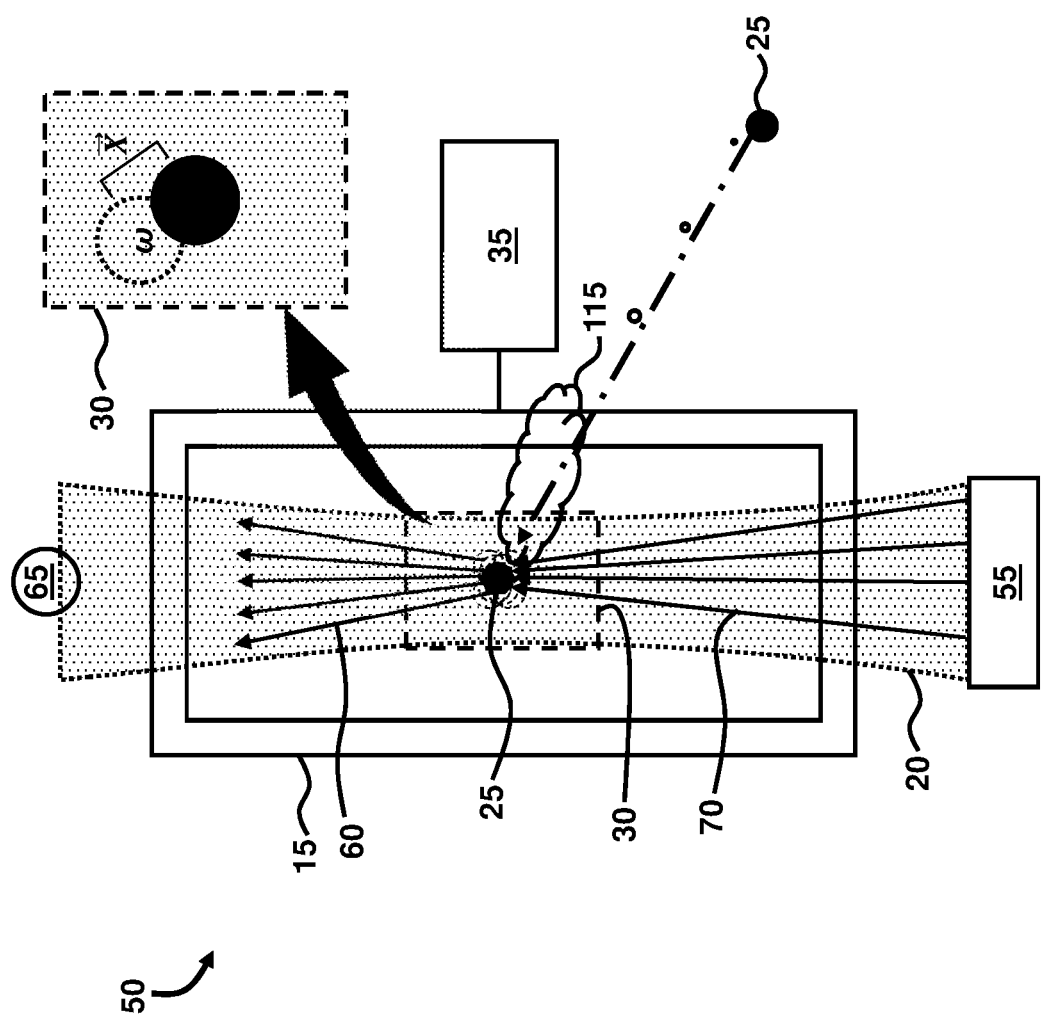
FIG. 13B is a schematic block diagram illustrating introducing a nanoparticle into the vacuum chamber of the system of FIG. 7 by providing an inert gas, according to an embodiment herein.
Figure 13C:
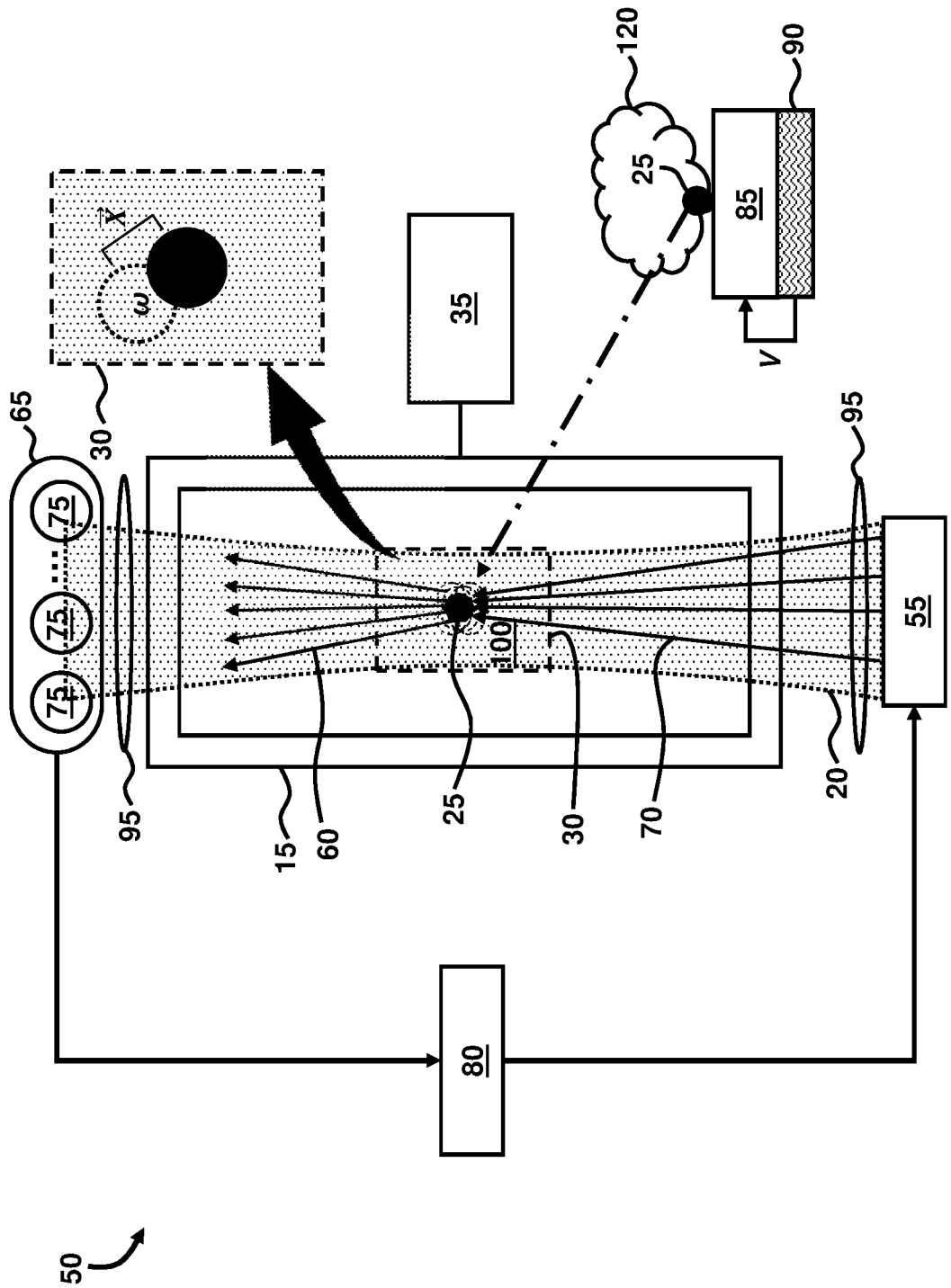
FIG. 13C is a schematic block diagram illustrating applying a gas mixture to a nanoparticle of the system of FIG. 7, according to an example herein.

FIG. 10, with reference to FIGS. 1 through 9, illustrates that the system 50 may comprise a base structure 85 to initially hold the nanoparticle 25 prior to introduction of the nanoparticle 25 into the vacuum chamber 15; and a piezoelectric device 90 operatively connected to the base structure 85 to receive a voltage V to cause the base structure 85 to vibrate and transmit the nanoparticle 25 into the vacuum chamber 15 in an oscillating state. According to an example, the base structure 85 may be configured as a glass slide or other similarly-configured device, and may be approximately 2-5 mm in radius (although other sizes and configurations are possible in accordance with the embodiments herein) and utilize Van der Waals forces to attach the nanoparticle 25 to the base structure 85. In an example, the piezoelectric device 90 may contain a crystal that expands upon receiving the voltage V, which causes the base structure 85 to vibrate (e.g., using the piezoelectric effects provided by the piezoelectric device 90) thereby detaching the nanoparticle 25. The applied voltage V may be set at any suitable level to cause sufficient vibration of the base structure 85 in order to dislodge or launch the nanoparticle 25 into the vacuum chamber 15. Moreover, the voltage V may be set at a constant or variable level based on a desired vibration and/or launching speed of the nanoparticle 25, which may be based on the size and/or configuration of the nanoparticle 25, according to some examples.

FIG. 11, with reference to FIGS. 1 through 10, illustrates that the system 50 may comprise at least one lens 95 to direct the focus 30 of the laser beam 20 in a defined trap region 100 of the vacuum chamber 15. The at least one lens 95 may comprise any of a convex lens, a concave lens, and a combination thereof arranged to direct the focus 30 of the laser beam 20 in the trap region 100 of the vacuum chamber 15. Furthermore, the at least one lens 95 may be made of any suitable material to permit the optical functionality required to sufficiently direct the focus 30 of the laser beam 20 in the trap region 100 of the vacuum chamber 15. Moreover, the nanoparticle 25 that is trapped in the optical dipole trap region 100 is configured to constantly oscillate in the trap region 100 due to the trapping potential of the laser beam 20.

FIG. 12, with reference to FIGS. 1 through 11, illustrates that an electric field density $E_1$ in the trap region 100 may be greater than the electric field density $E_2$ in areas 105 outside of the trap region 100 in the vacuum chamber 15. The embodiments herein are not restricted to any particular level for the electric field density $E_1$ and/or $E_2$, as the generated electric field density $E_1$ and/or $E_2$ may be dictated by various factors including the strength or intensity of the laser beam 20, the speed of the nanoparticle 25, as well as the characteristics of the nanoparticle 25 itself.

FIG. 13A, with reference to FIGS. 1 through 12, illustrates that the nanoparticle 25 may be introduced into the vacuum chamber 15 by spraying an aerosol 110 comprising the nanoparticle 25 into the vacuum chamber 15. The aerosol 110 may comprise any suitable type of spray capable of containing the nanoparticle 25 and directing the nanoparticle 25 into the vacuum chamber 15. In an example, the aerosol 110 comprises an inert spray/material so as to not affect the material characteristics of the nanoparticle 25, and the resulting optical properties of the nanoparticle 25 upon being hit or interfered with the laser beam 20.

FIG. 13B, with reference to FIGS. 1 through 13A, illustrates that the nanoparticle 25 may be introduced into the vacuum chamber 15 by providing a buffered or inert gas 115 comprising the nanoparticle 25 into the vacuum chamber 15. In an example, the inert gas 115 may comprise $N_2Ar$, and may be directed as part of the aerosol 110 or may be provided in another non-aerosol form. FIG. 13C, with reference to FIGS. 1 through 13B, illustrates that a gas mixture 120 is applied to the nanoparticle 25 as the nanoparticle 25 is released from the vibrating base structure 85. Similarly, the gas mixture 120 may comprise an inert gas such as $N_2Ar$ and may be part of the aerosol 110 and/or inert gas 115 as described above, or the gas mixture 120 may be a separate mixture that is applied to the nanoparticle 25 in addition to or alterative to the aerosol 110 and/or inert gas 115. In an example, the gas mixture 120 does not enter the vacuum chamber 15 with the nanoparticle 25, but rather is only provided to assist in releasing the nanoparticle 25 from the base structure 85.

FIG. 14, with reference to FIGS. 1 through 13C, illustrates that a second laser beam 21 may be applied to the nanoparticle 25, which may control the speed of the nanoparticle 25 in the vacuum chamber 15. In this regard, the nanoparticle 25 may be launched from a structure 85 such as a glass slide using any suitable technique as described above, such as using the aerosol 110, gas mixture 120, and/or applying the voltage V to cause the base structure 85 to vibrate and transmit the nanoparticle 25 into the vacuum chamber 15 in an oscillating state. The second laser beam 21 may then slow down the nanoparticle 25. According to an example, the second laser beam 21 may comprise the same or different strength or intensity as the (first) laser beam 20. In some examples, the second laser beam 21 may comprise any suitable wavelength of light such as 532 nm, 1064 nm, and 1550 nm, although other suitable wavelengths may be utilized in accordance with the embodiments herein.

FIG. 15A, with reference to FIGS. 1 through 14, illustrates a method 150 of measuring an acceleration of a nanoparticle 25. The method 150 comprises focusing (152) a first laser beam 20 in a vacuum chamber 15 to define a trap region 100 in the vacuum chamber 15. In an example, the first laser beam 20 may comprise any suitable wavelength of light such as 532 nm, 1064 nm, and 1550 nm, although other suitable wavelengths may be utilized in accordance with the embodiments herein. Furthermore, the nanoparticle 25 may comprise any suitable material and size as described above.

Next, the method 150 comprises introducing (154) the nanoparticle 25 into the trap region 100. The nanoparticle 25 may be introduced using various techniques as further described below. According to the embodiments therein, the nanoparticle 25 may comprise a speed that has to be controlled to ensure the nanoparticle 25 remains in an oscillated and levitated state in the trap region 100 of the vacuum chamber 15. The method 150 further comprises detecting (156) positions of the nanoparticle 25 as the nanoparticle 25 oscillates in the trap region 100. The embodiments herein are not restricted to any particular type of detecting (156) process so long as the positions of the nanoparticle 25 can be accurately measured. For example, image processing techniques performed by the processor 35 in conjunction with a plurality of photodetectors 40 may be utilized for the detecting (156) process. Thereafter, the method 150 comprises measuring (158) an acceleration of the nanoparticle 25 based on the detected positions and a frequency of oscillation of the nanoparticle 25. The processor 35 may be used to calculate the measuring (158) process in real-time and a feedback mechanism such as modulator 80, may be utilized to change the intensity of the laser beam 20 to ensure proper positioning of the nanoparticle 25 in the trap region 100 of the vacuum chamber 15.

As such, it may be challenging to control the nanoparticle 25 in order to have the nanoparticle 25 enter the vacuum chamber 15 and be retained in the vacuum chamber 15. Accordingly, the method 150 may increase the strength of the trap region 100 by increasing the electric field density $E_1$ in the trap region 100 to be greater than the electric field density $E_2$ in areas 105 outside of the trap region 100 in the vacuum chamber 15. This may be accomplished by modulating the strength of the laser beam 20; e.g., using modulator 80, such that the laser beam 20 begins as being relatively weak in strength or intensity and then quickly increases in strength or intensity.

The mechanism of optical trapping described herein works with focused laser light 70 of any wavelength $\lambda$ and any nanoparticle 25 that has no dimension larger than that wavelength $\lambda$. The fact that the nanoparticle 25 is trapped in the trap region 100 by virtue of its polarizability, and the fact that all matter has non-zero polarizability indicates that any suitable material could be used for the nanoparticle 25. In this regard, and as described above, the embodiments herein are not restricted to any particular shape and/or configuration of the nanoparticle 25. Moreover, the choice of material for the nanoparticle 25 may affect the sensitivity and dynamic range available to the accelerometer 10 and/or system 50. In some examples, higher power and more silicon-like nanoparticles 25 with lower wavelengths $\lambda$ may yield a better dynamic range for a particular target oscillation frequency co. Additionally, the power of the laser beam 20 and the width of the focus 30 of the laser beam 20 can be tuned during operation to optimize the properties of the accelerometer 10 and/or system 50 to the particular operational environment.

FIGS. 15B through 15D illustrate various techniques for introducing (154) the nanoparticle 25 into the vacuum chamber 15. FIG. 15B, with reference to FIGS. 1 through 15A, illustrates that the introducing (154) of the nanoparticle 25 may comprise spraying (160) an aerosol 110 comprising the nanoparticle 25 into the vacuum chamber 15. As described above, the aerosol 110 may comprise any suitable type of spray capable of containing the nanoparticle 25 and directing the nanoparticle 25 into the vacuum chamber 15. In an example, the aerosol 110 comprises an inert spray/material so as to not affect the material characteristics of the nanoparticle 25, and the resulting optical properties of the nanoparticle 25 upon being hit or interfered with the laser beam 20. FIG. 15C, with reference to FIGS. 1 through 15B, illustrates that the introducing (154) of the nanoparticle 25 may comprise providing (162) an inert gas 115 comprising the nanoparticle 25 into the vacuum chamber 15. In an example, and as described above, the inert gas 115 may comprise $N_2Ar$, and may be directed as part of the aerosol 110 or may be provided in another non-aerosol form.

FIG. 15D, with reference to FIGS. 1 through 15C, illustrates that the introducing (154) of the nanoparticle 25 may comprise releasing (164) the nanoparticle 25 into the vacuum chamber 15 from a vibrating base structure 85; and controlling (166) a speed of the nanoparticle 25 in the vacuum chamber 15. The releasing (164) of the nanoparticle 25 from the vibrating base structure 85 may include any suitable technique such as the techniques described above including using an aerosol 110 and applying a voltage V to a piezoelectric device 90 operatively connected to the base structure 85, among other techniques. The controlling (166) of the speed of the nanoparticle 25 in the vacuum chamber 15 may be practical in order to ensure the nanoparticle 25 remains in an oscillating and levitating state in the trap region 100 of the vacuum chamber 15. FIG. 15E and FIG. 15F further describe the controlling (166) process.

FIG. 15E, with reference to FIGS. 1 through 15D, illustrates that the controlling (166) of the speed of the nanoparticle 25 in the vacuum chamber 15 may comprise applying (168) a second laser beam 21 to the nanoparticle 25. In this regard, the second laser beam 21 may comprise light photons to slow the speed of the nanoparticle 25 upon entering the vacuum chamber 15. As described above and according to an example, the second laser beam 21 may comprise the same or different strength or intensity as the (first) laser beam 20. In some examples, the second laser beam 21 may comprise any suitable wavelength of light such as 532 nm, 1064 nm, and 1550 nm, although other suitable wavelengths may be utilized in accordance with the embodiments herein. Moreover, the second laser beam 21 may be emitted from a different source than is used to emit the first laser beam 20, in one example.

FIG. 15F, with reference to FIGS. 1 through 15E, illustrates that the controlling (166) of the speed of the nanoparticle 25 in the vacuum chamber 15 may comprise applying (170) a gas mixture 120 to the nanoparticle 25 as the nanoparticle 25 is released from the vibrating base structure 85. In this regard, the gas mixture 120 may slow down the speed of the nanoparticle 25 as the nanoparticle enters the vacuum chamber 15. The gas mixture 120 may comprise an inert gas such as $N_2Ar$ and may be part of the aerosol 110 and/or inert gas 115 as described above, or the gas mixture 120 may be a separate mixture that is applied to the nanoparticle 25 in addition to or alterative to the aerosol 110 and/or inert gas 115.

FIG. 15G, with reference to FIGS. 1 through 15F, illustrates that the method 150 may comprise monitoring (172) a movement of the nanoparticle 25 in the vacuum chamber 15; and controlling (174) an energy level of the nanoparticle 25 as the nanoparticle 25 oscillates in the trap region 100. These monitoring (172) and controlling (174) processes may be considered to be a "cooling" technique such as parametric feedback cooling, which removes energy from the nanoparticle 25 because there are substantially no frictional forces to slow the nanoparticle 25 in the vacuum chamber 15. In an embodiment, the controlling (174) process may occur by introducing a second laser beam 21 to the nanoparticle 25, for example, in order to bombard the nanoparticle 25 with photons; e.g., light scattering. The monitoring (172) process may occur using photodiode sensors 75, for example, which may monitor the light emitted from the nanoparticle 25 upon being "cooled". Moreover, the monitoring (172) process may ensure that the nanoparticle 25 remains within the trap region 100 in the vacuum chamber 15, which may further assist in correlating the acceleration of the nanoparticle 25 to a connected apparatus, which allows for an application of an accelerometer 10.

FIG. 15H, with reference to FIGS. 1 through 15G, illustrates that the measuring (158) of the acceleration of the nanoparticle 25 based on the detected positions and the frequency of oscillation may comprise measuring (176) a center of the nanoparticle 25 with respect to a center of the trap region 100 using the processor 35. The potential seen by the nanoparticle 25 will look quadratic near the center of the trap region 100 even though it is not quadratic everywhere. It may be desired to know the portion of the trap region 100 for which it is reasonable to approximate that the potential is quadratic. A "looser trap" is preferred because $S_{\vec{a}} = \omega^2 S_{\vec{x}_0}$.

The trap region 100 can be made looser either by widening the focus 30 of the laser beam 20 or by reducing the power, strength, or intensity of the laser beam 20. If the trap region 100 is too weak and the acceleration is too strong, the nanoparticle 25 may be pulled into inharmonic regions of the trap region 100 or pulled out of the trap region 100 entirely.

There may be restrictions on how far the nanoparticle 25 may be pulled from the center of the trap region 100. Ideally, one could just make the focus 30 of the laser beam 20 very wide and the power of the laser beam 20 very large to have a low frequency but deep trap region 100. However, power of the laser beam 20 may be limited by what is available and by what could (or could not) melt the nanoparticle 25. Neither the sensitivity nor the dynamic range are affected directly by the mass or volume of the nanoparticle 25. Taking a non-limiting example, if the nanoparticle 25 is configured as a single atom in the trap region 100, it should oscillate at some frequency, and if the nanoparticle 25 comprises two atoms mostly co-located in the trap region 100, they should also oscillate at the frequency. Furthermore, binding those atoms together should not cause them to behave any differently. Moreover, this concept may extend all the way to larger (but still sub-wavelength) nanoparticles 25.

The embodiments herein provide an optically levitated nanoparticle accelerometer 10, system 50, and method 150 of measuring the acceleration of a nanoparticle 25; e.g., using an optically trapped nanoparticle 25 to measure a force (e.g., gravitational, inertial, etc.) by measuring displacements of the center of oscillation of the nanoparticle 25. A laser beam 20 is focused to a point in space (e.g., trap region 100) in a vacuum chamber 15. A sub-wavelength-sized nanoparticle 25 is held in the center of the focus 30 of the laser beam 20 by virtue of its polarizability. The nanoparticle 25 scatters light 60 which is then used to track the position of the nanoparticle 25. In an example, the intensity of the laser beam 20, and therefore the strength of the trap region 100, is modulated so that the trap region 100 is always looser as the nanoparticle 25 moves toward its center of oscillation. Thus, the kinetic and potential energy of the nanoparticle 25 is reduced. Moreover, the inertial or gravitational acceleration causes the center of oscillation of the nanoparticle 25 to be displaced from the center of the optical trap region 100 by an amount proportional to that acceleration.

The foregoing description of the specific embodiments will so fully reveal the general nature of the embodiments herein that others can, by applying current knowledge, readily modify and/or adapt for various applications such specific embodiments without departing from the generic concept, and, therefore, such adaptations and modifications should and are intended to be comprehended within the meaning and range of equivalents of the disclosed embodiments. It is to be understood that the phraseology or terminology employed herein is for the purpose of description and not of limitation. Those skilled in the art will recognize that the embodiments herein can be practiced with modification within the spirit and scope of the appended claims.

What is claimed is:
1. An accelerometer comprising:
a vacuum chamber to receive a first laser beam and a nanoparticle, the first laser beam having an axis and a focus having three dimensions, wherein the nanoparticle is trapped in an oscillating state in the three-dimensional focus of the first laser beam;

a processor to calculate an acceleration of the nanoparticle based on changes in position of the oscillating nanoparticle; and a plurality of photodetectors that are spaced apart to identify spatial coordinates of the oscillating nanoparticle, wherein the photodetectors are aligned to sense interference between light from the first laser beam and light from the first laser beam scattered by the nanoparticle.

2. The accelerometer of claim 1, wherein the processor calculates the acceleration of the nanoparticle based on changes in the spatial coordinates of the oscillating nanoparticle and a frequency of oscillation of the nanoparticle within the vacuum chamber.

3. The accelerometer of claim 1, wherein the nanoparticle comprises a diameter of a predetermined size and is trapped in the focus of the first laser beam based on a polarizability of the nanoparticle, wherein the focus comprises a trap region having an electric field density $E_1$ provided by the first laser greater than an electric field density $E_2$ in areas outside of the trap region.

4. The accelerometer of claim 3, wherein the diameter of the predetermined size of the nanoparticle is smaller than a wavelength of the laser beam.

5. The accelerometer of claim 1, wherein the processor comprises any of an integrated circuit, an application specific integrated circuit, field-programmable gate array, and a microcontroller.

6. A system comprising:
a laser source to generate a laser beam;
a vacuum chamber comprising a levitating nanoparticle oscillating in a focus of the laser beam, wherein the nanoparticle scatters light;
at least one sensor to detect a position of the nanoparticle by sensing an interference between light from the laser beam and the light scattered by the nanoparticle; and
a processor to determine an acceleration of the nanoparticle based on a displacement in the position of the nanoparticle and a frequency of oscillation of the nanoparticle while the nanoparticle is oscillating in the focus of the laser beam.

7. The system of claim 6, wherein the at least one sensor comprises an array of photodiode sensors to monitor the scattered light emitting from the nanoparticle and the light from the laser beam that is not scattered by the nanoparticle, and determine a three-dimensional motion of the nanoparticle while the nanoparticle is oscillating in the focus of the laser beam.

8. The system of claim 6, comprising a modulator to control an intensity of the laser beam.

9. The system of claim 6, comprising:
a base structure to initially hold the nanoparticle prior to introduction of the nanoparticle into the vacuum chamber; and a piezoelectric device operatively connected to the base structure to receive a voltage to cause the base structure to vibrate and transmit the nanoparticle into the vacuum chamber in an oscillating state.

10. The system of claim 6, comprising at least one lens to direct the focus of the laser beam in a defined trap region of the vacuum chamber.

11. The system of claim 10, wherein an electric field density in the trap region is greater than the electric field density in areas outside of the trap region in the vacuum chamber.

12. A method of measuring an acceleration of a nanoparticle, the method comprising:
focusing a first laser beam having an axis in a vacuum chamber to define a three-dimensional trap region in the vacuum chamber;
introducing a nanoparticle into the trap region such that the nanoparticle oscillates within the trap region;
detecting positions of the nanoparticle as the nanoparticle oscillates in the trap region using a plurality of spaced apart photodetectors positioned within the laser beam; and
measuring an acceleration of the nanoparticle based on the detected positions and a frequency of oscillation of the nanoparticle.

13. The method of claim 12, wherein introducing the nanoparticle comprises spraying an aerosol comprising the nanoparticle into the vacuum chamber.

14. The method of claim 12, wherein introducing the nanoparticle comprises providing an inert gas comprising the nanoparticle into the vacuum chamber.

15. The method of claim 12, wherein introducing the nanoparticle comprises:
releasing the nanoparticle into the vacuum chamber from a vibrating base structure; and
controlling a speed of the nanoparticle in the vacuum chamber.

16. The method of claim 15, wherein controlling the speed of the nanoparticle in the vacuum chamber comprises applying a second laser beam to the nanoparticle.

17. The method of claim 15, wherein controlling the speed of the nanoparticle in the vacuum chamber comprises applying a gas mixture to the nanoparticle as the nanoparticle is released from the vibrating base structure.

18. The method of claim 12, comprising:
monitoring a movement of the nanoparticle in the vacuum chamber; and
controlling an energy level of the nanoparticle as the nanoparticle oscillates in the trap region.

19. The method of claim 12, wherein the measuring of the acceleration of the nanoparticle based on the detected positions and the frequency of oscillation comprises measuring a center of the nanoparticle with respect to a center of the trap region.

* * * * *